United States Patent
Matsumoto et al.

(10) Patent No.: US 7,229,566 B2
(45) Date of Patent: Jun. 12, 2007

(54) POSITION DETECTING METHOD AND APPARATUS

(75) Inventors: Takahiro Matsumoto, Tochigi (JP); Hideki Ina, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 303 days.

(21) Appl. No.: 10/664,998

(22) Filed: Sep. 18, 2003

(65) Prior Publication Data

US 2004/0058540 A1 Mar. 25, 2004

(30) Foreign Application Priority Data

Sep. 20, 2002 (JP) .............................. 2002-275824

(51) Int. Cl.
*G01B 11/00* (2006.01)

(52) U.S. Cl. .................. 216/60; 216/85; 356/401; 438/14; 438/16; 702/150

(58) Field of Classification Search .................. None
See application file for complete search history.

(56) References Cited

U.S. PATENT DOCUMENTS

| | | | | | |
|---|---|---|---|---|---|
| 4,962,318 A | * | 10/1990 | Nishi | ........................ | 250/548 |
| 5,561,606 A | * | 10/1996 | Ota et al. | ..................... | 716/19 |
| 5,754,300 A | * | 5/1998 | Magome et al. | ............ | 356/401 |
| 5,808,910 A | * | 9/1998 | Irie et al. | .................... | 700/279 |
| 5,986,766 A | * | 11/1999 | Koga et al. | ................. | 356/401 |
| 6,856,931 B2 | * | 2/2005 | Yoshida | ..................... | 702/127 |
| 2002/0042664 A1 | | 4/2002 | Kikuchi | ..................... | 700/114 |

FOREIGN PATENT DOCUMENTS

JP 8-94315 4/1996

* cited by examiner

*Primary Examiner*—Anita Alanko
(74) *Attorney, Agent, or Firm*—Morgan & Finnegan, L.L.P.

(57) ABSTRACT

A two-dimensional image of an alignment mark 30 is acquired by an alignment scope 15 at step S61, and the two-dimensional image acquired at step S61 is converted to a light-intensity signal line by line at step S62. A selection as to whether each line signal is valid or unnecessary is made at step S63. The amount of positional deviation of the alignment mark 30 is calculated using only valid line signals at step S64.

8 Claims, 23 Drawing Sheets

POSITION DETECTING METHOD AND APPARATUS

FIELD OF THE INVENTION

This invention relates to position detecting method and apparatus effective in aligning a wafer or reticle in a semiconductor exposure apparatus, by way of example.

BACKGROUND OF THE INVENTION

In a projection-type exposure apparatus utilized in the manufacture of various devices, e.g., semiconductor chips such as IC and LSI chips, display elements such as liquid crystal panels, detecting elements such as magnetic heads, and image sensors such as CCDs, an increase in the fineness and density of the circuits used in these devices has been accompanied by the need to project a circuit pattern on the surface of a reticle onto the surface of a wafer, to thereby expose the wafer to the pattern, at a higher resolution.

Since the projection resolution of a circuit pattern depends upon the NA (numerical aperture) of the projection optical system and the wavelength of the exposing light, a method of enlarging the NA of the projection optical system or a method of shortening the wavelength of the exposing light has been adopted as a method of raising resolution. In relation to the latter method, a shift from g rays to i rays and from i rays to an excimer laser is in progress in regard to the exposing light source. Exposure systems based upon excimer lasers having lasing wavelengths of 248 nm and 193 nm have already been put into practical use.

Exposure systems of even shorter lasing wavelengths, namely a VUV exposure system that utilizes exposing light having a wavelength of 157 nm and an EUV exposure system that utilizes exposing light having a wavelength of 13 nm, are being studied as candidates for next-generation exposure systems.

Further, processes for manufacturing semiconductor devices have become highly diversified, and methods such as CMP (Chemical Mechanical Polishing) have been introduced as flattening techniques for solving the problem of inadequate focal depth encountered in exposure systems.

Structures and materials of semiconductor devices also are multifarious. For example, a P-HEMT (Pseudomorphic High Electron Mobility Transistor) and an M-HEMT (Metamorphe-HEMT), which are obtained by combining compounds such as GaAs and InP, etc., and an HBT (Heterojunction Bipolar Transistor), which employs SiGe or SiGeC, have been proposed.

Meanwhile, finer circuit patterns have led to the need for highly precise alignment of the reticle, on which the circuit pattern is formed, and the wafer, onto which the circuit pattern is projected. The required precision is ⅓ of the circuit line width. For example, the required precision in current 180-nm designs is 60 nm, or ⅓ of 180.

Alignment in an exposure apparatus is carried out by exposing a wafer to the circuit pattern on a reticle and alignment marks simultaneously to transfer the circuit pattern and alignment marks, detecting the position of the alignment marks optically when the wafer is exposed to the circuit pattern of the next reticle, and positioning the wafer with respect to the reticle. Methods of detecting an alignment mark include a method of capturing the image of the alignment mark upon enlarging the image by a microscope, and then detecting the position of the mark image, and a method of using a diffraction grating as an alignment mark, detecting the phase of an interference signal that interferes with the diffracted light, and detecting the position of the diffraction grating.

The state of the art in the semiconductor industry is such that raising overlay accuracy for aligning the design pattern of the next step and the circuit pattern already on the wafer is essential for the purpose of improving the performance of semiconductor devices and the yield of manufacture insofar as an exposure apparatus is used. However, owing to the introduction of special semiconductor manufacturing techniques such as the CMP process, the structure of circuit patterns has been improved but a frequently occurring problem is the occurrence of a variation in the shape of the alignment marks between wafers or between shots and an attendant decline in alignment precision.

This is caused by the fact that an increase in the fineness of circuit patterns is accompanied by an increase in the difference between the line width of the circuit pattern and the line width of the alignment mark. In another words, the above problem arises because process conditions relating to film formation, etching and CMP, etc., are optimized to the line width of a fine circuit pattern (a line width of 0.1 to 0.15 μm), and therefore, with an alignment mark having a large line width (a line width of 0.6 to 4.0 μm), in many cases the process conditions are not appropriate.

When it is attempted to make the line width of an alignment mark conform to the line width of a circuit pattern, there is a decline in signal strength or contrast because the resolution of the detection optical system used in alignment is inadequate. The result is a decline in the stability of the alignment-mark detection signal. In order to realize a detection optical system capable of detecting an alignment mark having a line width equivalent to that of a circuit pattern, a large NA and a light source having a short wavelength are required. This necessitates a detection optical system equivalent to that of a projection optical system and therefore gives rise to a new problem, namely an increase in the cost of the apparatus.

FIG. 18 is a diagram illustrating alignment marks that have been acquired in a semiconductor manufacturing process.

After a reticle and wafer have been aligned in such a manner that a circuit pattern on the reticle will be transferred to the center of alignment marks 101, 102, 103 and 104 on the wafer in FIG. 18, a resist pattern 105 is formed through exposure and development steps. A method of detecting alignment-mark position along the Y direction in FIG. 18 will be described as an example. Specifically, an average value Ym1 of a position intermediate the positions of the alignment marks 101 and 103 and a deviation in the position of a cent r point Ym2 of a resist mark 105 are detected. Here the alignment-mark image processing range is as illustrated. Position information regarding the marks 101 and 103 is calculated after this area is integrated along the non-detection direction (the X direction).

Accordingly, if the alignment marks have unevenness, as shown in FIG. 18, averaging is achieved to a certain extent over the image processing range but an error occurs in a case where amount of deviation relative to the resist pattern is calculated.

In view of these circumstances, efforts have been made to change process conditions so as to thereby obtain conditions suited to both the alignment mark and circuit pattern. To achieve this, conditions are set by trial and error, or various types of alignment marks having different line widths are fabricated, exposure is evaluated and use is made of the alignment mark whose line width is deemed to be best.

Accordingly, an enormous amount of time is required to decide the optimum conditions (parameters). Further, a process error, for example, may occur after parameters have been decided. In such case it may be necessary to alter the parameters of the exposure apparatus to follow up a modification in the manufacturing process in response to the process error. Altering the parameters takes a great deal of time.

In the future, moreover, further progress will be made in producing finer circuit patterns, new semiconductor processes will be introduced and wafers of larger diameter (on the order of 300 mm) will be used. As a result, it is predicted that it will be increasingly difficult to fabricate both circuit patterns and alignment marks that are defect-free over the entire surface of a wafer.

SUMMARY OF THE INVENTION

Accordingly, an object of the present invention is to provide a position detection method and apparatus capable of performing high-precision detection without detracting from the precision of alignment-mark detection even in a case where alignment marks formed on a wafer are flawed to some extent.

According to the present invention, the foregoing object is attained by providing a position detection method for detecting the position of an object upon receiving light from a plurality of position detection marks on the object, comprising: an image information acquisition step of obtaining image information of the position detection marks from the light that has been received; a conversion step of converting the image information to a light-intensity signal for each line of a plurality of lines partitioned in a direction substantially orthogonal to a direction in which the position detection marks are detected; a determination step of determining whether the light-intensity signal of each line is valid or not; and a position information calculation step of calculating position information of the position detection marks from light-intensity signals of valid lines.

Further, according to the present invention, the foregoing object is attained by providing a position detection apparatus for detecting the position of an object upon receiving light from a plurality of position detection marks on the object, comprising: an image information acquisition unit for obtaining image information of the position detection marks from the light that has been received; a conversion unit for converting the image information to a light-intensity signal for each line of a plurality of lines partitioned in a direction substantially orthogonal to a direction in which the position detection marks are detected; a determination unit for determining whether the light-intensity signal of each line is valid or not; and a position information calculation unit for calculating position information of the position detection marks from a valid light-intensity signal of a line.

Preferably, the above-described position detection method and apparatus calculate information representing an error of a position detection mark, which corresponds to the position information, with respect to a reference position.

An exposure apparatus according to the present invention has a stage device driven in order to position the object based upon error information calculated by the above-described position detection apparatus, the stage device positioning a substrate or a reticle or both as the object.

A method of manufacturing a semiconductor device according to the present invention comprises the steps of placing a group of manufacturing equipment for various processes, inclusive of the above-described exposure apparatus, in a plant for manufacturing semiconductor devices; and manufacturing a semiconductor device by a plurality of processes using this group of manufacturing equipment.

A semiconductor manufacturing plant according to the present invention comprises: a group of manufacturing equipment for various processes, inclusive of the above-described exposure apparatus; a local-area network for interconnecting the group of manufacturing equipment; and a gateway for making it possible to access, from the local-area network, an external network outside the plant; whereby information relating to at least one of the pieces of manufacturing equipment can be communicated by data communication.

A method of maintaining an exposure apparatus according to the present invention, namely a method of maintained the above-described exposure apparatus that has been installed in a semiconductor manufacturing plant, comprises the steps of: providing a maintenance database, which is connected to an external network of the semiconductor manufacturing plant, by a vendor or user of the exposure apparatus; allowing access to the maintenance database from within the semiconductor manufacturing plant via the external network; and transmitting maintenance information, which is stored in the maintenance database, to the side of the semiconductor manufacturing plant via the external network.

Preferably, the exposure apparatus includes a display, a network interface and a computer for running network software, wherein maintenance information relating to the exposure apparatus is capable of being communicated via a computer network.

Thus, as described above, the present invention is such that even if a position detection mark has a defect, mark position can be detected highly precisely without being affected by the defect in execution of global alignment.

In particular, in a case where the present invention is applied to alignment of a wafer or reticle in a semiconductor exposure apparatus, susceptibility to the influence of mark defects ascribable to the semiconductor process is reduced, alignment precision can be improved and it is possible to raise yield in a process for manufacturing semiconductor devices.

Further, the productivity of semiconductor-device manufacture can be improved because it is possible to shorten the time needed to set semiconductor-process conditions necessary to stabilize alignment-mark shape.

Furthermore, in a case where the present invention is applied to an apparatus for verifying overlay accuracy used in a process for manufacturing semiconductors, detection error ascribable to a defect in an overlay verification mark ascribable to a semiconductor process can be reduced and whether an article is acceptable or not can be discriminated with better accuracy. In addition, overlay accuracy can be improved by causing the detected value to be reflected as an offset in an exposure apparatus.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

DETAILED DESCRIPTION OF THE PREFERRED EMBODIMENTS

Preferred embodiments of the present invention will now be described with reference to the accompanying drawings.

[Structure of Exposure Apparatus]

Figure 1:
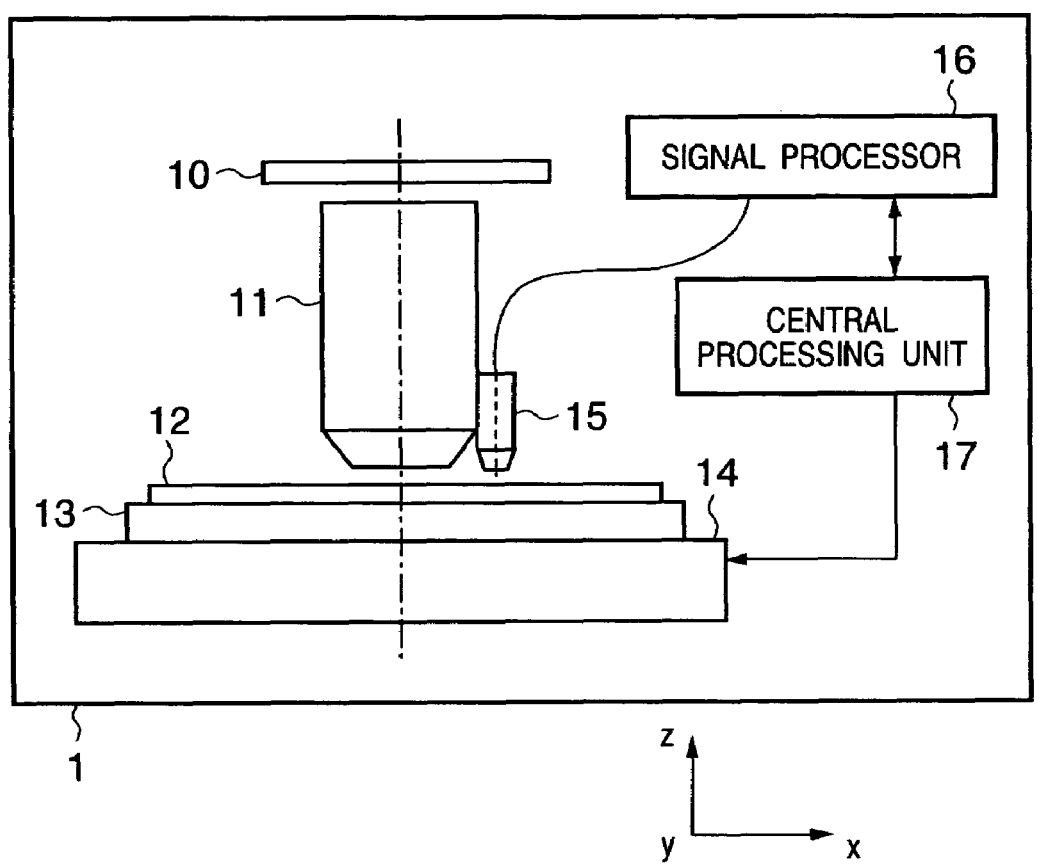
FIG. 1 is a schematic view illustrating a semiconductor exposure apparatus according to an embodiment of the present invention.

FIG. 1 is a schematic view illustrating a semiconductor exposure apparatus according to this embodiment of the present invention.

As shown in FIG. 1, a semiconductor exposure apparatus (referred to also as an exposure apparatus below) 1 comprises a projection optical system 11 for demagnifying and projecting a reticle 10 on which a predetermined circuit pattern has been formed; a wafer chuck 13 for holding a wafer 12 on which a base pattern and an alignment mark have been formed by a preceding step; a wafer stage 14 for positioning the wafer 12 at a predetermined position (alignment position); and an alignment detecting optical system (alignment scope) 15 for detecting the position of the alignment mark that has been formed on the wafer 12.

The principle for detecting an alignment mark by the alignment detecting optical system 15 will now be described.

Figure 2:
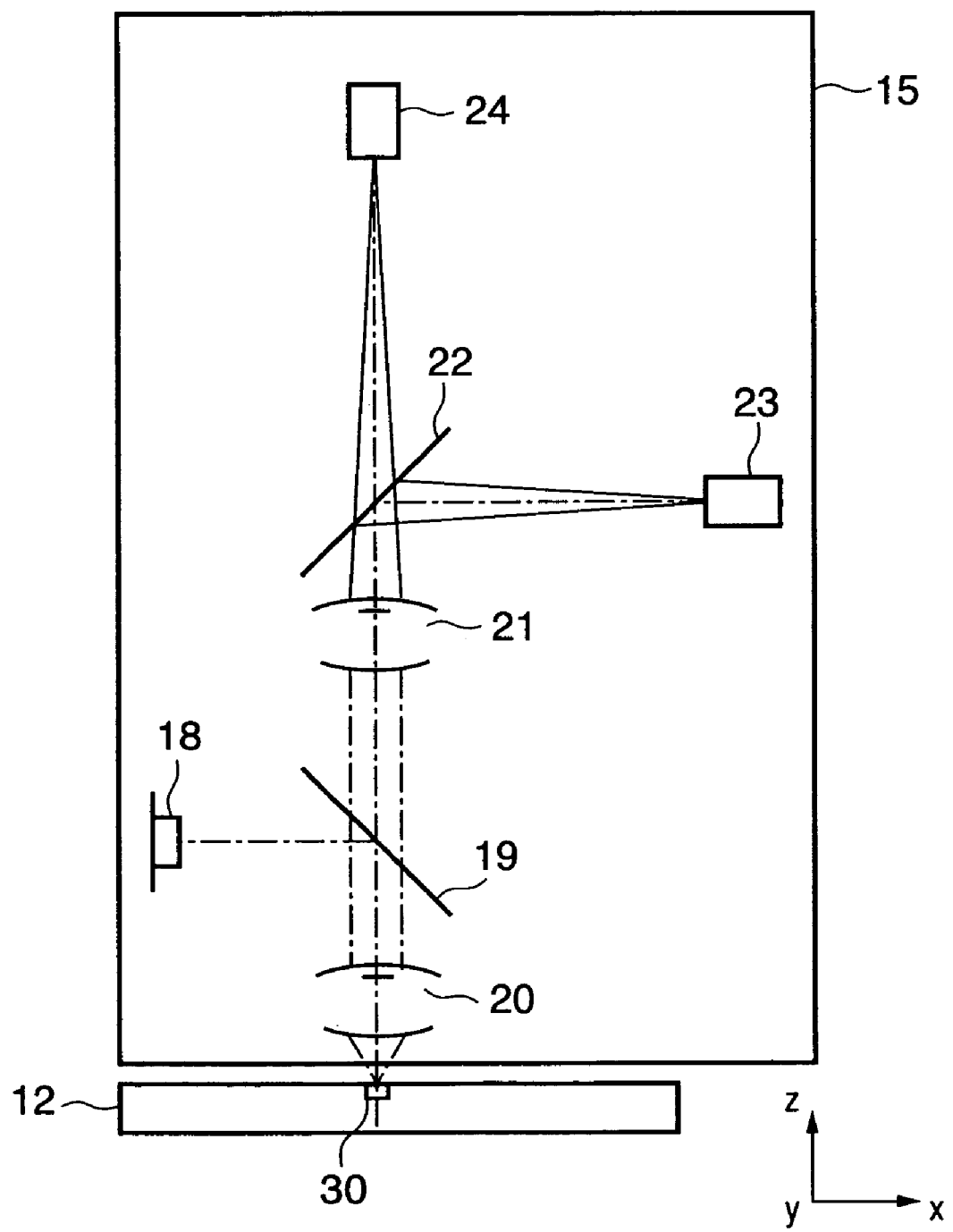
FIG. 2 is a schematic view illustrating an alignment detecting optical system according to this embodiment.

FIG. 2 is a schematic view illustrating the main structural components of the alignment detecting optical system 15.

As shown in FIG. 2, illuminating light from a light source 18 is reflected by a beam splitter 19, impinges upon a lens 20 and illuminates an alignment mark 30 on the wafer 12 from the lens 20. Diffracted light from the alignment mark 30 passes through the lens 20, beam splitter 19 and a lens 21 and is split by a beam splitter 22, and the split beams are received by respective ones of image sensors 23, 24. The alignment mark 30 is enlarged at an image-forming magnification on the order of 100× by the lenses 20 and 21 and the enlarged image is formed on the image sensors 23, 24. The image sensors 23 and 24 are used to detect a shift in the position of the alignment mark 30 along the X and Y directions, respectively, and are placed at an angle of approximately 90° with respect to the optic axis.

The description now returns to FIG. 1 upon taking the description of the alignment detecting optical system 15 into account. The image sensors 23, 24 send a signal processor 16 an image pick-up signal obtained by optoelectronically converting the optical image of the alignment mark 30. On the basis of the image pick-up signal, the signal processor 16 calculates position information representing the alignment mark 30. A central processing unit 17 positions the wafer stage 14 so as to correct positional deviation of the wafer based upon the position information calculated by the signal processor 16.

First Embodiment

A method of detecting th position of an alignment mark according to a first embodiment will be described next.

Since the principle through which the position of an alignment mark is detected in the X direction is the same as that in the Y direction, only the method of detecting the position of the alignment mark in the X direction will be described.

Figure 3:
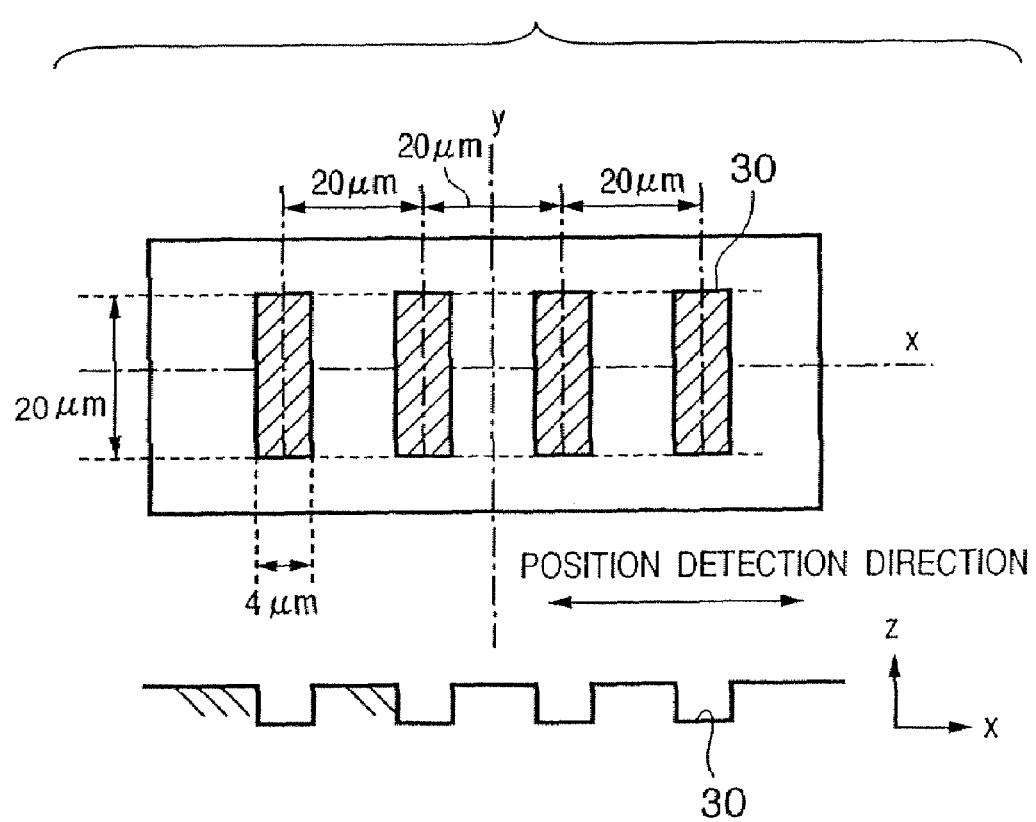
FIG. 3 is a diagram illustrating alignment marks according to this embodiment.
Figure 4:
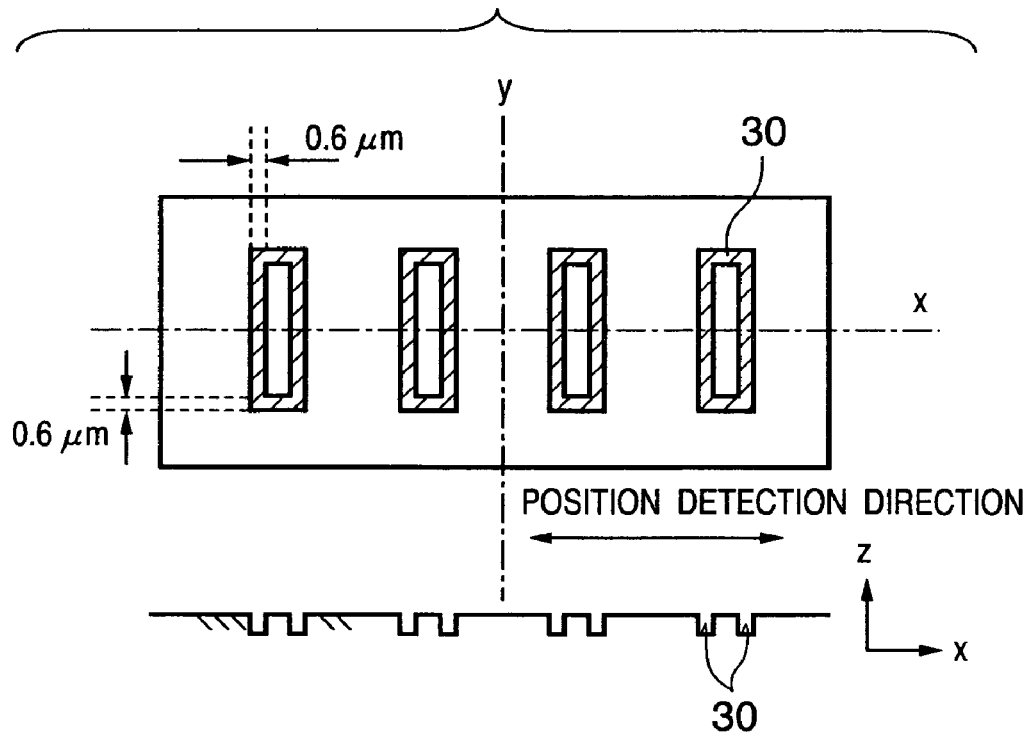
FIG. 4 is a diagram illustrating alignment marks according to this embodiment.

A mark having a shape of the kind shown in FIG. 3 or FIG. 4 is used as the alignment mark 30. In FIG. 3, four rectangular marks each having a length of 4 µm in the X direction, which is the mark detection direction, and a length 20 µm in the Y direction, which is substantially orthogonal to the mark detection direction, are arrayed at intervals of 20

μm in the X direction. The cross section of the mark is made concave by etching. In actuality, the mark is coated with a resist, though this is not illustrated. In FIG. 4, on the other hand, each mark has a shape obtained by forming an edge portion having a line width of 0.6 μm on the exterior of the marks shown in FIG. 3.

Figure 5:
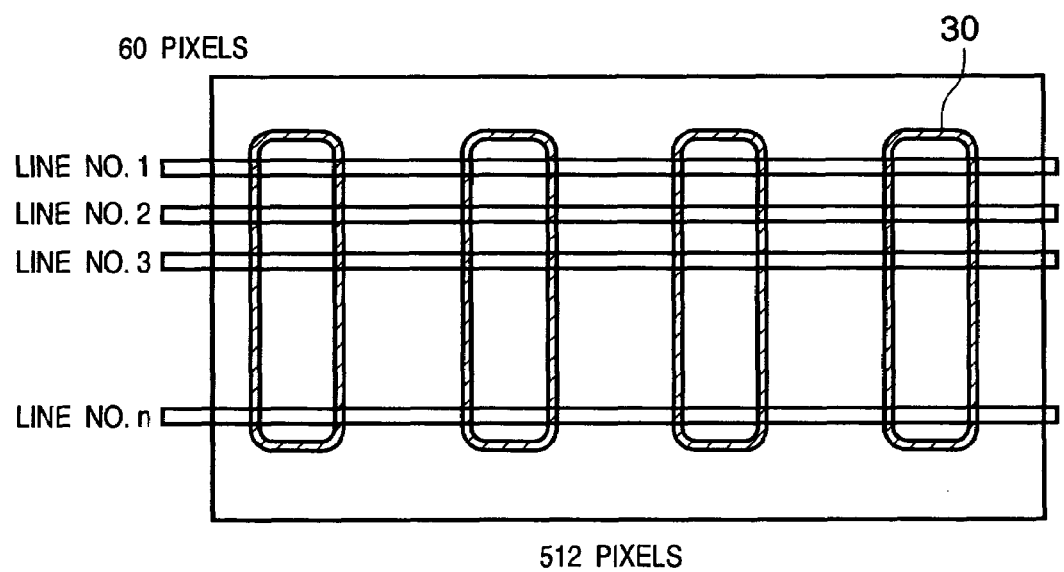
FIG. 5 is a diagram illustrating a two-dimensional image of alignment marks.

Even if alignment marks of the kind shown in FIG. 3 or 4 are used, a large angle that will not fall within the NA of the lenses in the alignment detecting optical system 15 is obtained, and image information picked up by the image sensor 23 becomes as shown in FIG. 5 owing to the occurrence of scattered light at the edges of the marks and interference with the scattered light at the edges of the marks. Further, the edge portions of the alignment marks of FIG. 3 appear dark, while the concave portions of the alignment marks in FIG. 4 appear dark or light. This is a characterizing feature of an image often observed in bright field images.

The image information representing the alignment mark thus sensed is processed by the signal processor 16 in the manner described below.

Figure 6:
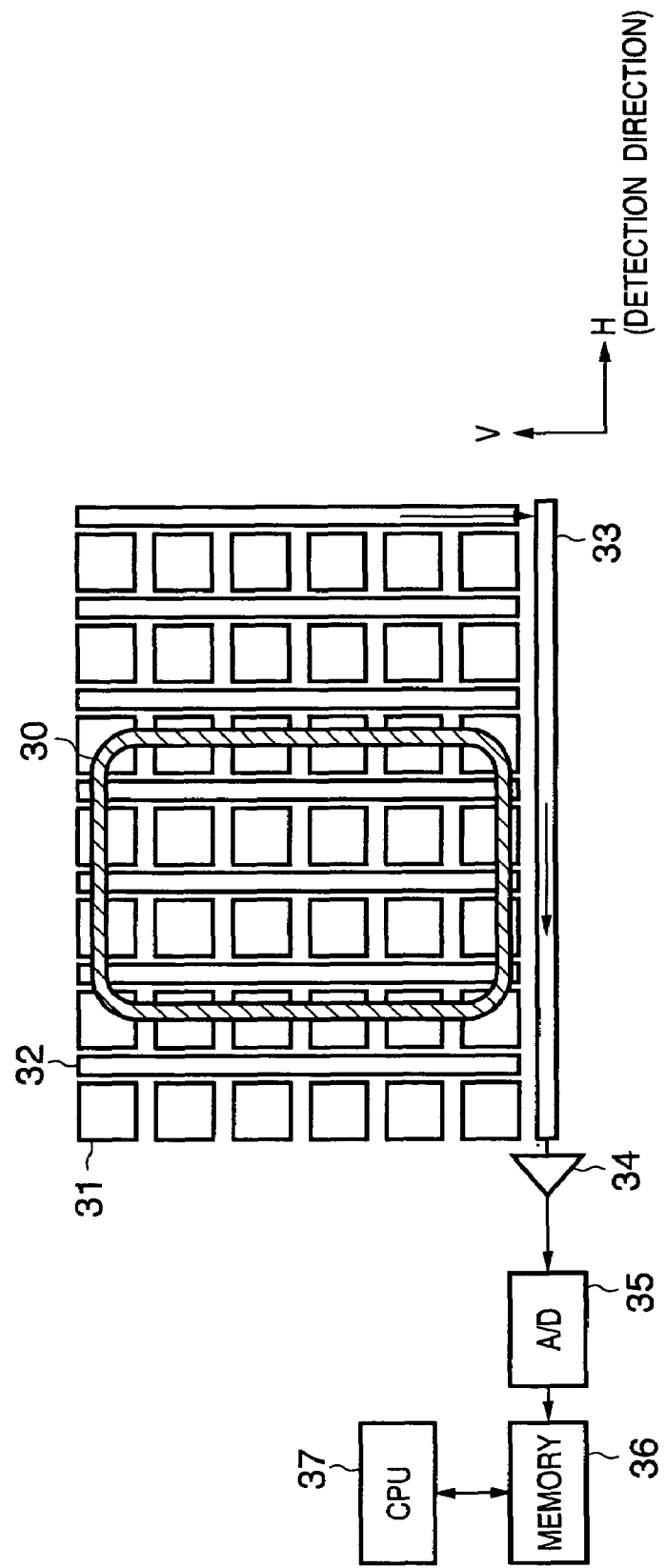
FIG. 6 is a diagram illustrating the structure of an image sensor.

FIG. 5 is a diagram illustrating a two-dimensional image of alignment marks, and FIG. 6 is a diagram illustrating the structure of an image sensor.

The image sensors 23, 24 in this embodiment are CCD cameras each having 512 pixels in the horizontal (X) direction and 60 pixels in the vertical (Y) direction for capturing two-dimensional image information of the alignment mark 30. Pixel pitch is 24 μm in both the H (horizontal) and V (vertical) directions. In order to facilitate the description, the number of pixels is 7 (horizontally)×6 (vertically) in FIG. 6, and the image of the alignment mark 30 is expressed schematically.

The image sensor shown in FIG. 6 includes photodiodes 31, a vertical transfer CCD 32, a horizontal transfer CCD 33 and an output circuit 34. Reference numerals 35, 36 and 37 denote an A/D converter, a memory and a CPU, respectively.

Electric charge resulting from a photo electric conversion by the photodiodes 31 is transferred vertically by the vertical transfer CCD 32, and such charge is transferred to the horizontal transfer CCD 33 in succession. Whenever one line (seven pixels in FIG. 6, but 512 pixels in actuality) of charge is thus input, the charge is transferred horizontally and is output as a sensed-image signal via the output circuit 34. Thus, a sensed-image signal on a line-by-line basis is converted to a digital signal by the A/D converter 35, after which the digital signal is stored in the memory 36. The CPU 37 controls CCD drive circuits (not shown) for the vertical and horizontal directions and manages signals in such a manner that the sensed-image signal of each line will correspond to the line number of that line.

Figure 7:
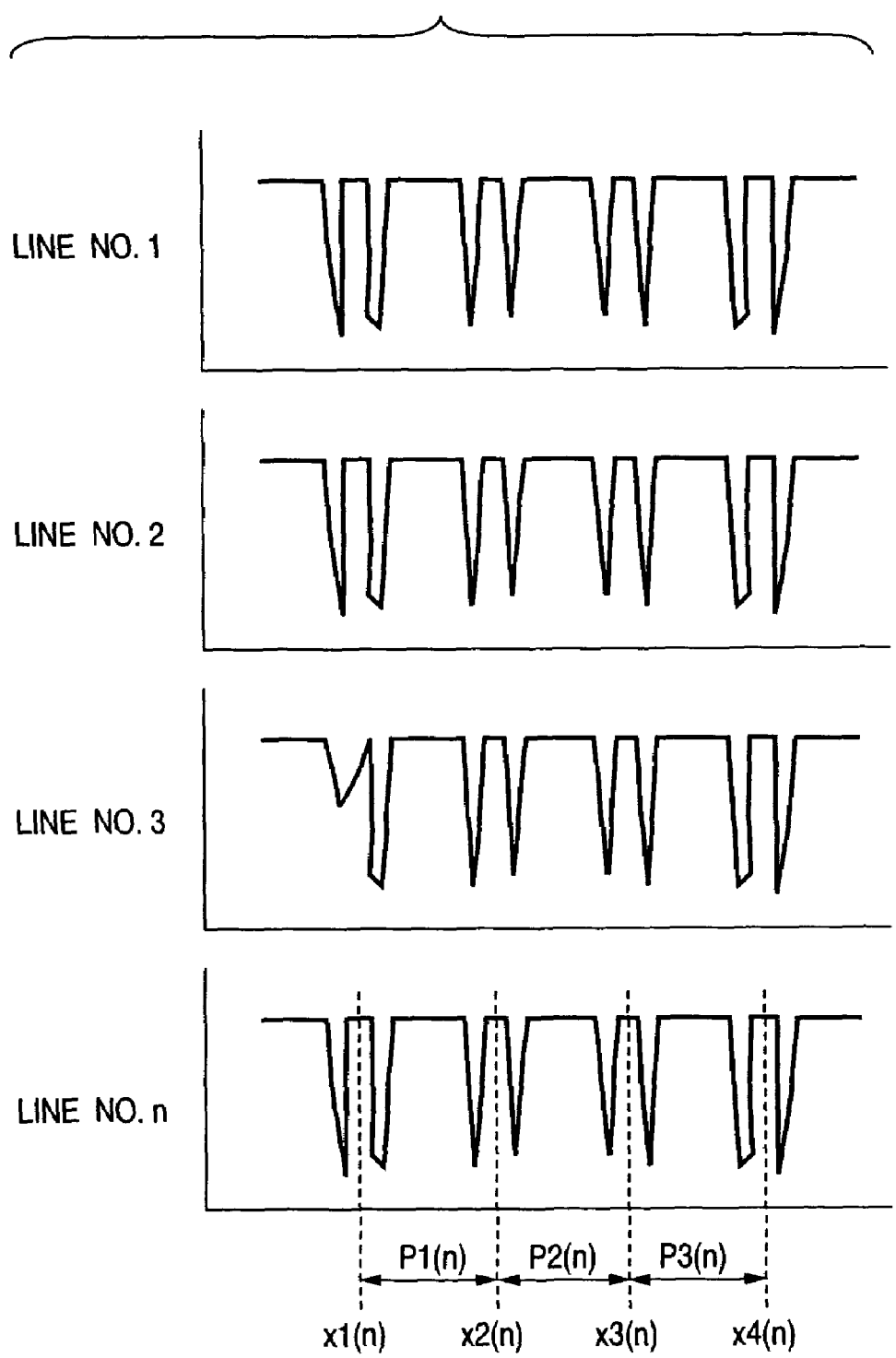
FIG. 7 is a diagram schematically illustrating an example of signal waveforms in a case where an alignment mark has a defect.

Thus, line-by-line sensed-image signals (referred to as "line signals") are acquired, as shown in FIG. 7, as a light-intensity distribution of each line (in the direction of detection). This serves as two-dimensional image information captured by the image sensor 23.

Signal processing for calculating alignment-mark position information from each line signal will be described next.

A template matching method is used to calculate alignment-mark position information according to this embodiment. Template matching calculates the correlation between a sensed-image signal, which represents image information indicated at S in FIG. 8, and a template (indicated at T in FIG. 8) retained beforehand on the apparatus side. Position information exhibiting the highest correlation is detected as the center position of the alignment mark. By obtaining the position of a centroid pixel of an area of several pixels to the left and right of a peak pixel in a function of correlation values illustrated at E in FIG. 8, a resolution of 1/10 to 1/50 pixel can be achieved.

An arithmetic equation used in template matching is represented by Equation (1) below.

$$E(X) = \frac{1}{\sum_{J=-k}^{k} |S(X+J) - T(J)|^2} \quad (1)$$

where S represents an image signal sensed by the image sensor, T a template and E the result of correlation.

Figure 8:
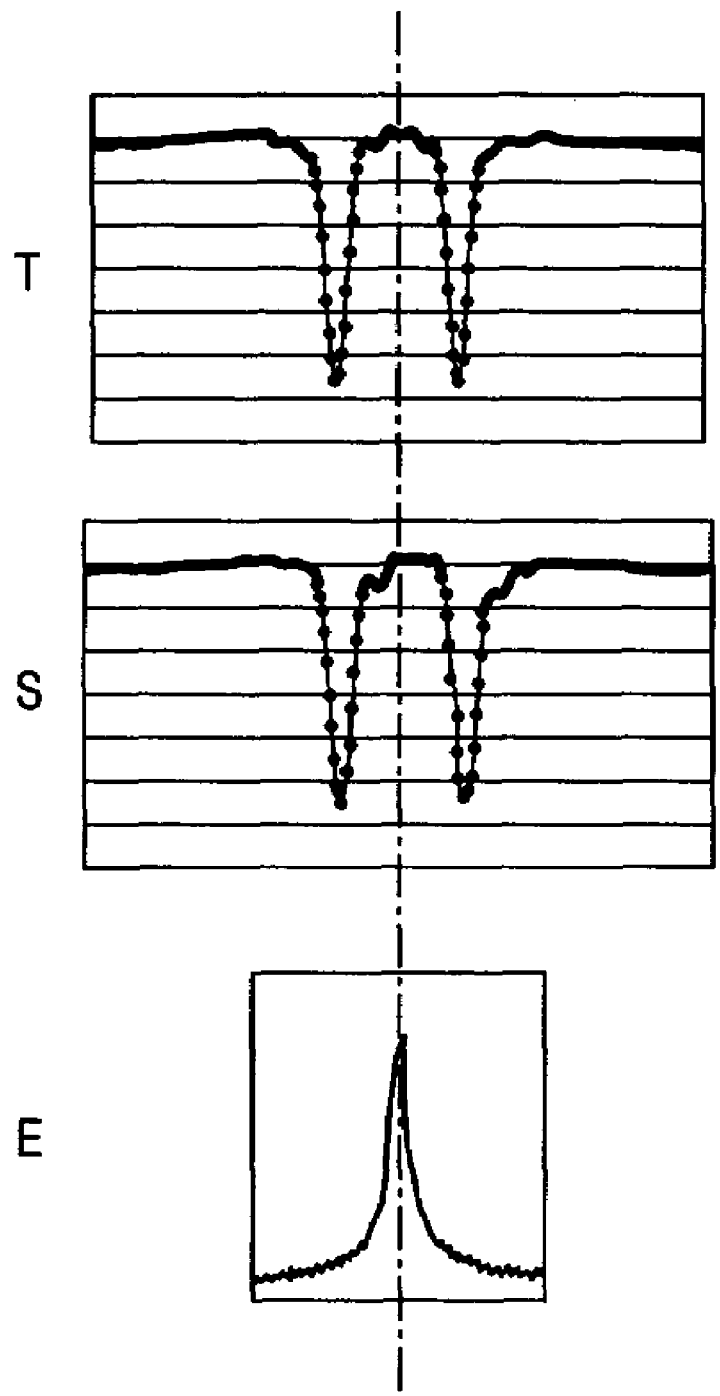
FIG. 8 is a diagram illustrating templates used in detecting alignment-mark position according to a first embodiment of the present invention.

The relationship among the signal S, template T and correlation value E becomes as shown in FIG. 8 when illustrated. FIG. 8 illustrates processing relating to image information concerning a single alignment mark among the four alignment marks. As for the template, there has been proposed a method of utilizing the symmetry of the sensed-image signal waveform to fold the left-half portion indicated at S in FIG. 8 with respect to the direction of detection, performing a correlation operation and detecting the alignment-mark position information (e.g., see the specification of Japanese Patent Application Laid-Open No. 8-94315). The calculation of alignment-mark position information is not limited to the template-matching method of this embodiment.

Similarly, in regard to the line signals of the three other alignment marks, each item of position information is detected from each line signal sensed by the image sensor by means of the template matching method.

First, position information X1(n), X2(n), X3(n), X4(n) of the alignment marks of each of the lines is found by the template matching method (the units are pixels), where n represents the line number. Thereafter, the average position of the alignment marks is found from Equation (2) below.

$$Xa(n)=[X1(n)+X2(n)+X3(n)+X4(n)]/4 \quad (2)$$

A deviation Xw(n) in the position of the alignment mark 30 from the sensed-image signal of each image sensor is obtained as $$Xw(n)=Xa(n)/(Px \cdot M) \quad (3)$$

where M represents the image forming magnification of the alignment detecting optical system 15 and Px the pixel pitch in the direction in which the alignment marks are detected by the image sensor 23. In the case of this embodiment, magnification M=100 holds and the pixel pitch is 24 μm. Accordingly, if position deviates by one pixel on the sensor, then this is equivalent to 24 μm/100=240 nm in regard to positional deviation of an alignment mark on a wafer.

Next, a method of deciding unnecessary line numbers in case of a defective alignment mark will be described.

FIG. 7 is a diagram schematically illustrating an example of a signal waveform in a case where an alignment mark at the left end of Line No. 3 has a defect. In FIG. 7, the signal waveform of Line No. 3 has a shape different from those of the other signal waveforms. According to this embodiment, the pitch (spacing) between neighboring ones of the four alignment marks is used as a criterion. Pitch P1($n$), P2($n$) and P3($n$) between neighboring alignment marks is easily found as P1($n$)=X2($n$)−X1($n$), P2($n$)=X3($n$)−X2($n$) and P3($n$)=X4($n$)−X3($n$).

The pitches P1(n), P2(n), P3(n) of the marks are averaged to find Pa(n), an average value Paa of Pa(n) obtained from each line signal is calculated, only line signals for which the deviations from the average value Paa fall within a predetermined range are used, and other line signals are not used.

Figure 9:
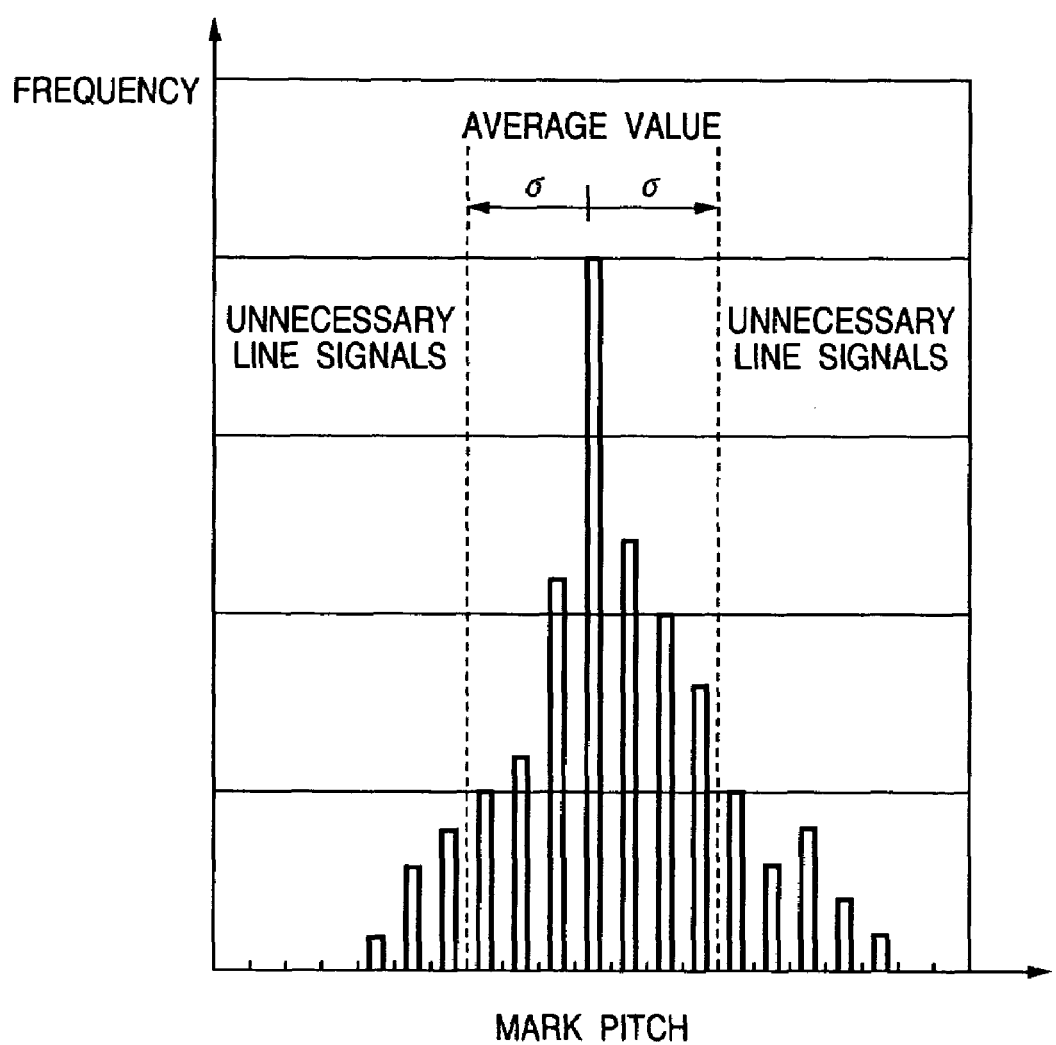
FIG. 9 is a diagram illustrating alignment-mark pitch and frequency distribution thereof obtained from the example of the signal waveforms of FIG. 7.

FIG. 9 illustrates alignment-mark pitch and frequency distribution thereof obtained from the line signals of FIG. 7. In this case, line signals outside a standard deviation σ are excluded, as unnecessary lines, from position-deviation detection processing.

Figure 10:
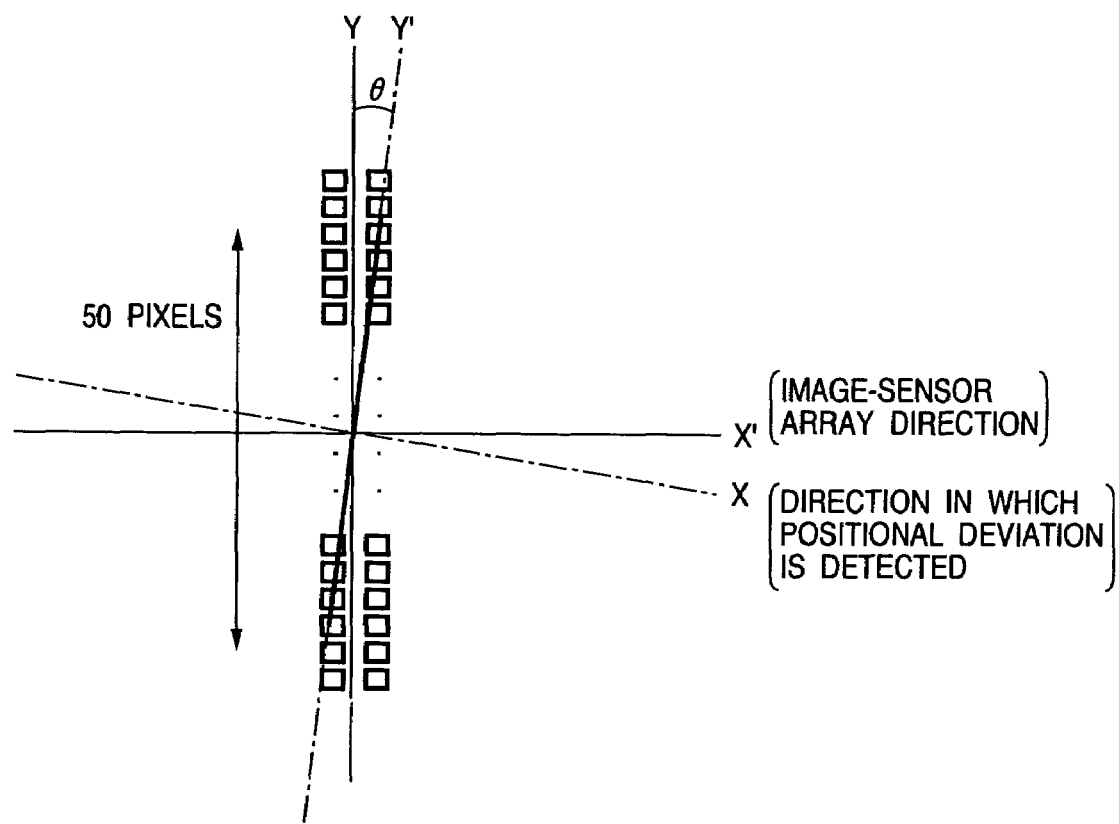
FIG. 10 is a diagram illustrating an example of placement of an image sensor.

In order to execute detection processing as rapidly as possible, this embodiment is such that the pixel pitch of the image sensor is made 24 μm, and a sensor having a very small number of pixels, namely 512×60 pixels, is used as the image sensor. In order to raise resolution, therefore, the image sensor is mounted in a particular way. Specifically, as shown in FIG. 10, the axis along the X' direction of the image sensor is set at an angle of rotation of θ with respect to the detection direction X of the alignment mark. The rotation angle θ is set to an angle of 20 mrad, which is equivalent to one pixel along the X' direction, at both ends (equivalent to 50 pixels) of the mark along the non-detection direction (Y direction). As a result, in a case where all lines can be used, detection resolution can be improved up to 1/50 theoretically in comparison with a case where there is no rotation of the image sensor. On the other hand, owing to the rotation angle θ, an offset is produced in the line signal of each line. Though there are no problems in a case where all lines are processed, a problem does arise if valid line signals are picked up, as in this example. Accordingly, a position-shift offset value S(n) is set for every line in dependence upon the rotation angle θ. The offset value S(n) is represented by Equation (4) below, where n represents the line number, since the number of lines is 50 and 240 nm is the amount of positional deviation of one pixel.

$$S(n)=240/50 \times n \, [nm] \quad (4)$$

Accordingly, the deviation Xw in the position of the alignment mark is found as follows using only the result of signal processing of valid line signals lines:

$$Xw=1/N \times \Sigma[Xa(n)+S(n)] \quad (5)$$

where N represents the valid line number.

Each pixel of an image sensor generally has a dark component and there is a variation in the efficiency of the photo electric conversion. It is desirable, therefore, to sense the image of an alignment mark having an ideal, defect-free shape, such as a resist pattern, and acquire the difference between pixels as a correction value beforehand. At such time it is possible to also simultaneously acquire the offset value S(n) of every line that accompanies a difference in angle of rotation between the image sensor and alignment mark.

A method of detecting the position of an alignment mark along the X direction has been described above. A similar operation can be performed using the image sensor 24 with regard to detection of the position of an alignment mark along the Y direction (an X-direction alignment mark that has been rotated through 90°).

Further, in to this embodiment, there has been described an example of a case where an image sensor having a small total number of pixels arrayed at a coarse pitch is used in order to raise processing speed. However, CCDs the total number of pixels of which is greater than 40,000,000 and having a pixel pitch of 3.5 μm also are being produced. In a case where position detection of higher resolution is carried out, it is preferred that such a sensor having this fine pixel pitch be used. In this case, there are instances where the pixel pitch in the non-detection direction is finer and the number of lines exceeds 1000. At such time it will suffice to make the number of signals 10 to 50 by performing averaging over several tens of line signals and determine which of these are valid line signals and which are unnecessary line signals.

Furthermore, besides a CCD, a C-MOS-type sensor can also be used as the image sensor.

Described next with reference to the flowchart of FIG. 11 will be a method of calculating amount of positional deviation of an alignment mark using only the above-mentioned valid line signals.

Figure 11:
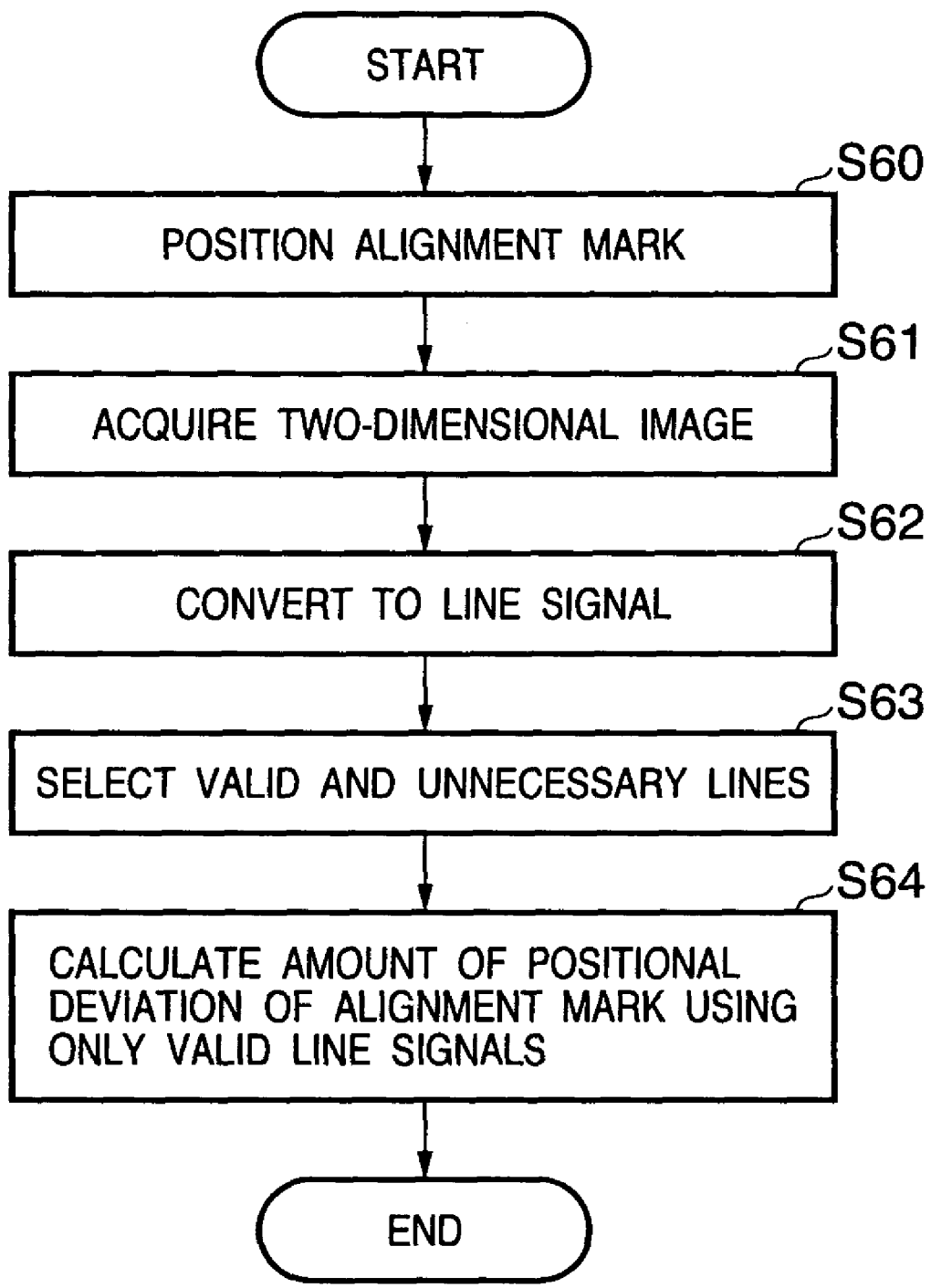
FIG. 11 is a flowchart illustrating processing for detecting alignment-mark position according to the first embodiment.

In FIG. 11, the alignment mark 30 to be detected on the wafer 12 is positioned below the alignment scope 15 at step S60. Here it is assumed that positional deviation of the wafer 12 is corrected for in advance as by prealignment in such a manner that the alignment mark 30 will fall within the effective visual field of the alignment scope 15.

A two-dimensional image of the alignment mark 30 is acquired by the alignment scope 15 at step S61.

The two-dimensional image acquired at step S61 is converted to a light-intensity signal line by line at step S62.

A selection as to whether each line signal is valid or unnecessary is made at step S63.

The amount of positional deviation of the alignment mark 30 is calculated using only valid line signals at step S64.

Thus, as set forth above, even if part of an alignment mark has a defect, the signal relating to the defective portion is eliminated effectively and the position of the alignment mark can be detected highly accurately without being influenced by the defect.

Next, a method of aligning a wafer from positional deviation of the alignment mark calculated as set forth above will be described.

Global alignment (AGA) is applied in this embodiment. With global alignment, several shots are selected from among all chips (shots) on a wafer (a selected shot shall be referred to as a "sample shot"), and position information concerning an alignment mark among the selected shots is detected.

Figure 12:
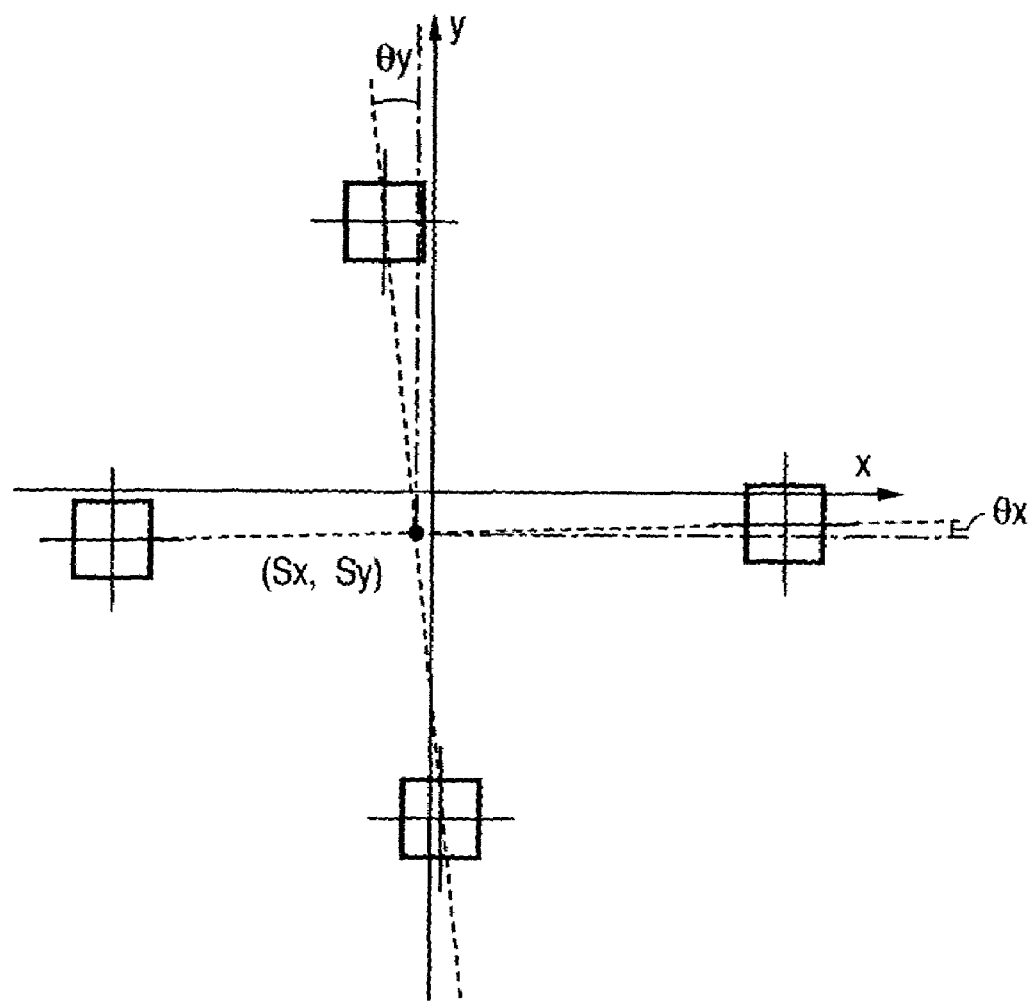
FIG. 12 is a diagram useful in describing global alignment.

FIG. 12 illustrates the manner in which an array of shots on a wafer has deviated with respect to the xy coordinate system of the wafer stage in the above-described exposure apparatus 1. The deviation in the position of the wafer can be described by six parameters, namely shift Sx in the x direction, shift Sy in the y direction, inclination θx with respect to the x axis, inclination θy with respect to the y axis, magnification Bx along the x direction and magnification By along the y direction. The magnifications Bx, By represent expansion and contraction of the wafer with the direction in which the wafer stage of the exposure apparatus is fed serving as a reference. This expansion and contraction of the wafer is caused by film formation and etching in the semiconductor process.

Let position information of each sample shot of AGA detected as set forth above be described as Ai (where i is the detected shot number), namely, $$Ai = \begin{pmatrix} xi \\ yi \end{pmatrix} \quad (6)$$

and let designed position coordinates of an alignment mark of a sample shot be described as Di, namely $$Di = \begin{pmatrix} Xi \\ Yi \end{pmatrix} \quad (7)$$

In AGA, the following linear coordinate transformation D'i is performed using the six parameters (Sx, Sy, θx, θy, Bx, By) representing the positional deviation of the wafer cited earlier:

$$D'i = \begin{pmatrix} Bx & -\theta y \\ \theta x & By \end{pmatrix} Di + \begin{pmatrix} Sx \\ Sy \end{pmatrix} \quad (8)$$

In Equation (8) above, θx, θy are assumed to be small for the sake of simplicity, and Bx=1, By=1, and therefore use is made of approximation equations such as cosθ=1, sinθ=0, θx*Bx=θx, θy*By=θy.

Figure 13:
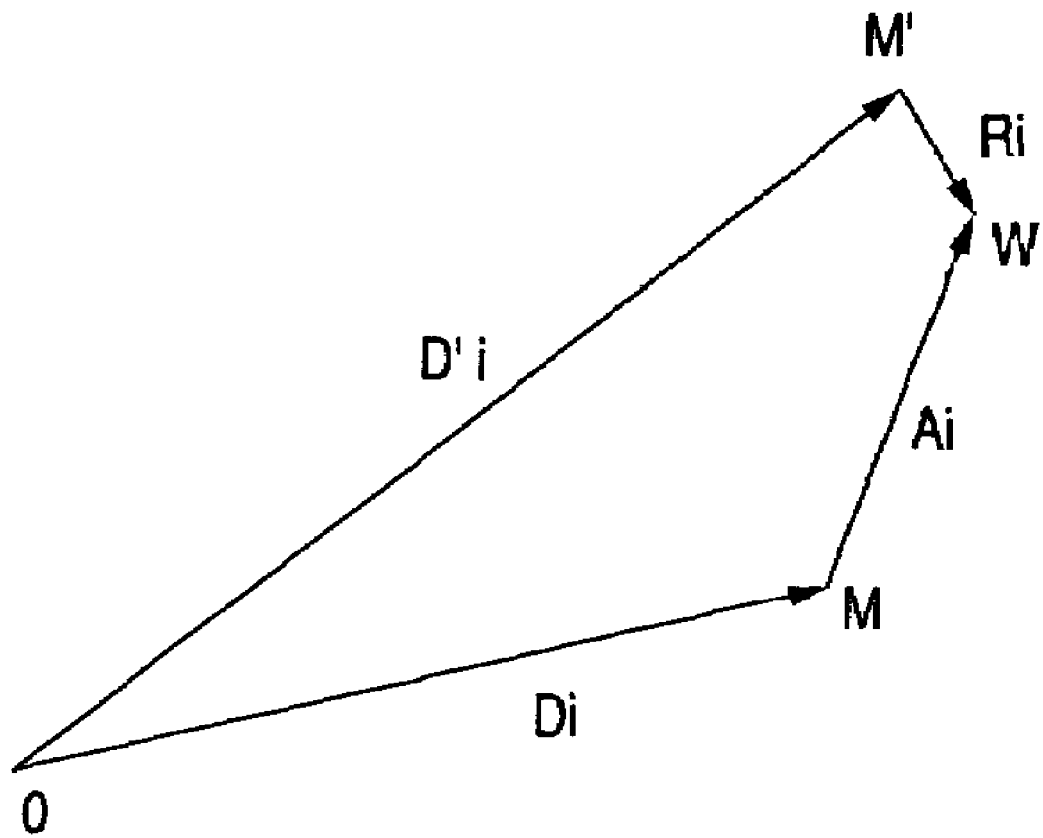
FIG. 13 is a diagram illustrating a linear coordinate transformation and residual error.

FIG. 13 illustrates the manner in which the linear coordinate transformation of Equation (8) is performed. An alignment mark on a wafer is located at the position indicated by W in FIG. 13. This is a deviation of Ai from the position of point M, which is the designed position. If the coordinate transformation D'i is carried out, the positional deviation (residual error) of the alignment mark on the wafer is calculated using Equation (9) b low.

$$Ri = (Di + Ai) - D'i \quad (9)$$

According to AGA, the method of least squares is applied so as to minimize the residual error Ri of each sample shot, and AGA parameters (Sx, Sy, θx, θy, Bx, By) that will minimize the mean sum of the squares of the residual error Ri are calculated.

$$V = \frac{1}{n} \sum |Ri|^2 \quad (10)$$

$$= \frac{1}{n} \sum_{i=1}^{i=n} \left| \begin{pmatrix} xi \\ yi \end{pmatrix} - \begin{pmatrix} Bx-1 & -\theta y \\ \theta x & By-1 \end{pmatrix} \begin{pmatrix} Xi \\ Yi \end{pmatrix} + \begin{pmatrix} Sx \\ Sy \end{pmatrix} \right|^2$$

$$\begin{pmatrix} \delta V / \delta Sx \\ \delta V / \delta Sy \\ \delta V / \delta \theta x \\ \delta V / \delta \theta y \\ \delta V / \delta Bx \\ \delta V / \delta By \end{pmatrix} = 0 \quad (11)$$

The AGA parameters (Sx, Sy, θx, θy, Bx, By) are found by substituting the position information (xi,yi) of the alignment mark of each sample shot and the alignment-mark designed position (Xi,Yi) into Equations (10) and (11) cited above, positioning of each shot is performed upon correcting for positional deviation based upon these AGA parameters, and the pattern on the reticle is transferred to the wafer by exposure.

Second Embodiment

A method of detecting alignment-mark position according to a second embodiment will now be described.

This embodiment is applied to alignment in a semiconductor exposure apparatus in a manner similar to that of the first embodiment. The method of selecting valid and unnecessary lines after acquisition of the two-dimensional image differs from that of the first embodiment. In the first embodiment, the pitch of alignment marks is utilized in the method of detecting valid lines. In the second embodiment, however, the residual error Ri of AGA calculated from the AGA parameters is utilized.

The structures of the exposure apparatus, alignment-mark detecting optical system and alignment mark are the same as those of the first embodiment and need not be described again.

First, in a manner similar to that of the first embodiment, a two-dimensional image of the alignment mark 30 on the wafer 12 is acquired for all sample shots of AGA. Next, after the conversion is made to the signals line by line, the alignment-mark position information X1(n), X2(n), X3(n), X4(n) of each line is found by the template matching method (the units are pixels). Furthermore, alignment-mark position information Xai(n) along the X direction is calculated from each line signal of every shot in accordance with Equation (2), where the subscript i represents the shot number. Alignment-mark position information Yai(n) along the Y direction is calculated in similar fashion.

The AGA parameters (Sx, Sy, θx, θy, Bx, By) are found by substituting the position information {Xai(n), Yai(n)} of each sample shot and the alignment-mark designed position (Xi,Yi) into Equations (10) and (11) cited above, and finding the residual error Ri(n)=[Rxi(n), Ryi(n)] of each line by further substituting these into Equation (9). Here a variation 3σx(n) in the residual error Ri(n) is calculated for every line.

Figure 14:
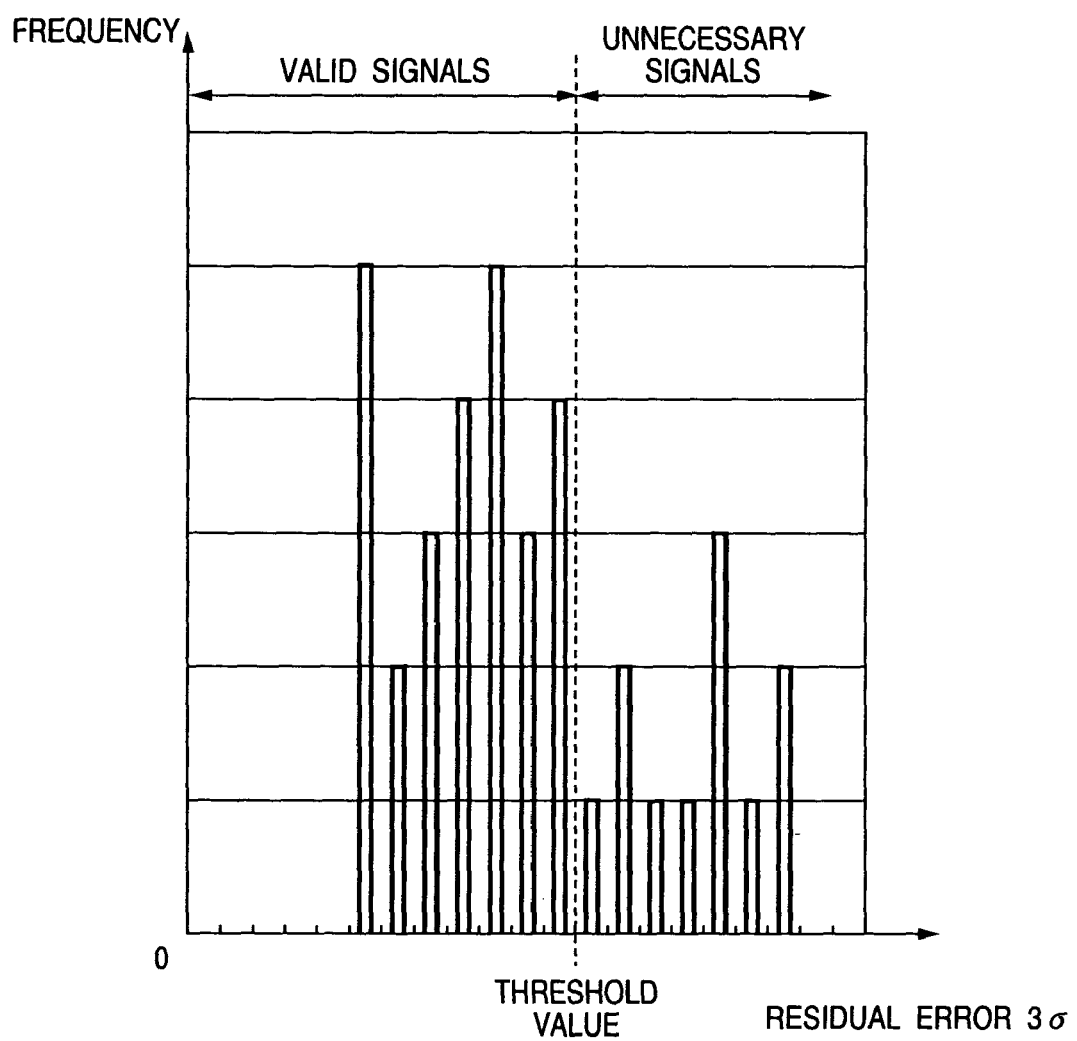
FIG. 14 is a diagram illustrating, in the form of a histogram, a variation $3\sigma x(n)$ in residual error $Ri(n)$ of each line.

FIG. 14 is a diagram illustrating, in the form of a histogram, a variation 3σx(n) in residual error Ri(n) of each line. In case of a line signal indicative of an abnormality such as a defect in an alignment mark, the result obtained will be as if the array of shots has shifted from a straight line and, hence, a large residual error is obtained. Only line signals for which the residual error is less than a predetermined threshold value are deemed to be valid, and line signals for which the residual error exceeds the threshold value are judged to be unnecessary line signals.

By virtue of the above method, the amount of positional deviation of each shot is found from Equation (5) using only the results of signal processing applied to valid line signals, the final AGA parameters (Sx, Sy, θx, θy, Bx, By) are found from the positional deviation and Equations (10), (11), positioning of each shot is performed upon correcting for positional deviation based upon these AGA parameters, and the pattern on the reticle is transferred to the wafer by exposure. The above-mentioned threshold value is made a value that is twice the positioning reproducibility precision of the wafer stage in this exposure apparatus.

The difference between the first and second embodiments may be viewed from a different standpoint. Specifically, in the first embodiment, unnecessary line signals are discriminated using only alignment marks within one shot, whereas in the second embodiment, use is made of line signals of alignment marks in a number of shots on a wafer. Conversely, in the first embodiment, it is required that a plurality of patterns of identical shape be arrayed at a specific pitch as the alignment marks. In the second embodiment, however, a single rectangular pattern suffices and a unique advantage is that the area occupied by alignment marks in a shot is reduced.

Further, besides the method of discriminating valid/unnecessary line signals illustrated in the first and second embodiments, it is permissible to adopt an arrangement in which a difference value between a template and a bestmatched signal obtained by the template matching method is found line by line, and a line signal for which the difference value is less than a predetermined threshold value is judged to be a valid line.

Furthermore, the exposure apparatus 1 illustrated in the first and second embodiments is exemplified as one having a demagnifying projection optical system. However, the exposure apparatus is not limited to such an arrangement. For example, the present invention is applicable to an X-ray exposure apparatus in which X rays serve as the exposing light source and a pattern on a mask is projected at a ratio of 1:1, and to an electron-beam exposure apparatus in which a plurality of shots are written on a wafer by an electron beam.

Third Embodiment

A third embodiment will now be described with regard to a method of detecting the position of an overlay verification mark. This method is for verifying the accuracy (overlay accuracy) of the position of a circuit pattern in a succeeding step relative to the position of an already existing pattern on a wafer.

Figure 15:
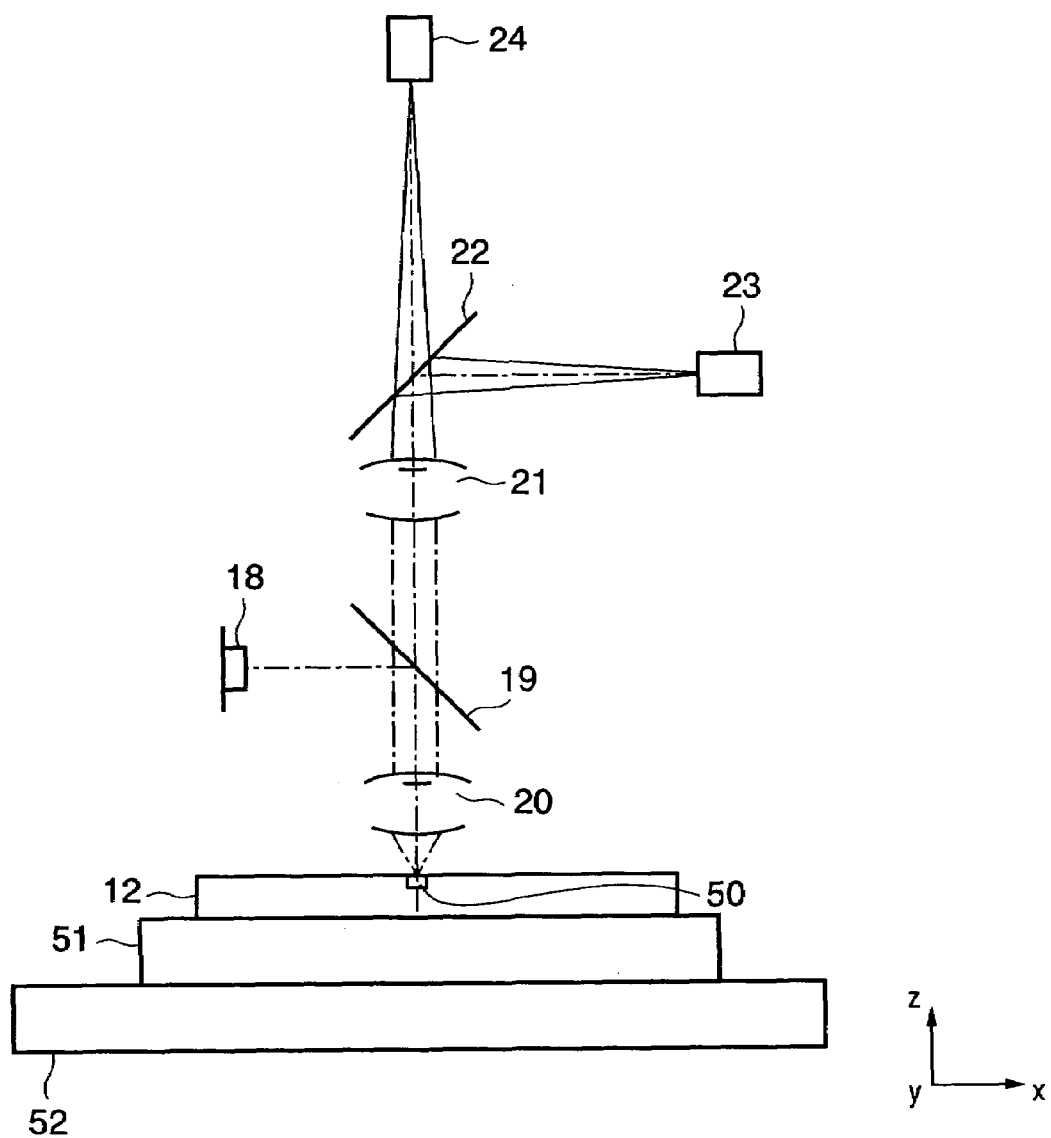
FIG. 15 is a schematic view illustrating an alignment-mark detecting optical system used in a method of detecting position of an overlay verification mark according to a third embodiment.

FIG. 15 is a schematic view illustrating the main components of an alignment-mark detecting optical system used in a method of detecting position of an overlay verification mark according to the third embodiment. Components identical with those of the first embodiment are designated by like reference characters.

In FIG. 15, the alignment detecting optical system of the third embodiment is used in an apparatus for verifying the accuracy (overlay accuracy) of the position of a circuit pattern in a succeeding step relative to the position of an already existing pattern on a wafer. Illuminating light from the light source 18 is reflected by the beam splitter 19, impinges upon the lens 20 and illuminates an overlay verification mark 50 on the wafer 12 from the lens 20. Diffracted light from the overlay verification mark 50 passes through the lens 20, beam splitter 19 and lens 21 and is split by the beam splitter 22, and the split beams are received by respective ones of the image sensors 23, 24.

The overlay verification mark 50 is enlarged at an image-forming magnification on the order of 100× by the lenses 20 and 21 and the enlarged image is formed on the image sensors 23, 24. The image sensors 23 and 24 are used to detect a shift in the position of the overlay verification mark 50 along the X and Y directions, respectively, and are placed at an angle of approximately 90° with respect to the optic axis.

Further, the wafer 12 is held on a wafer chuck 51, and the wafer chuck 51 is so adapted that the wafer 12 can be positioned relative to the alignment detecting optical system 15 by an XY stage 52.

A method of detecting the position of an overlay verification mark 50 according to the third embodiment will be described next.

Since the principle through which the position of an overlay verification mark is detected in the X direction is the same as that in the Y direction, only the method of detecting the position of the overlay verification mark in the X direction will be described.

Figure 16:
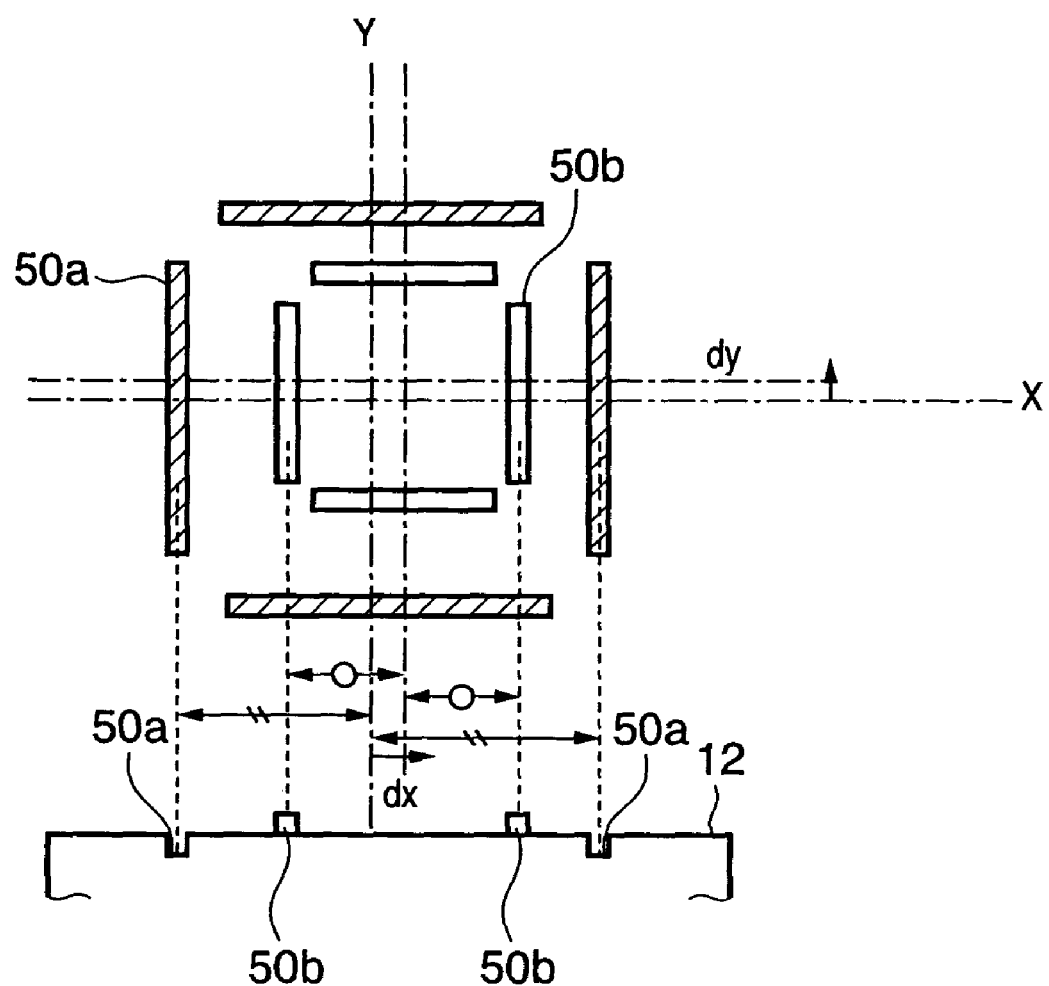
FIG. 16 is a diagram illustrating overlay verification marks according to the third embodiment.

Marks 50a, 50b shown in FIG. 16 are used as the overlay verification mark 50. In FIG. 16, two rectangular marks each having a length of 1 μm in the X direction, which is the mark detection direction, and a length 15 μm in the Y direction, which is substantially orthogonal to the mark detection direction, are arrayed at a spacing of 20 μm in the X direction as a base mark 50a indicating a layer position of a step preceding a semiconductor manufacturing step.

Further, two rectangular marks each having a length of 1 μm in the X direction and a length 7 μm in the Y direction are arrayed at a pitch of 10 μm inwardly of the base marks 50a as a mark 50b indicating the present layer position after positioning has been performed with respect to the mark 50a of the preceding step.

The base mark 50a is an etching mark that has been fabricated by a semiconductor process, and the mark 50b indicating the present layer position is a resist pattern. A deviation in the position of the present layer with respect to the layer of the preceding step is found by detecting amount of shift (dx,dy) in the center position of the two rectangular marks with respect to the center of the two rectangular marks 50a.

Figure 17:
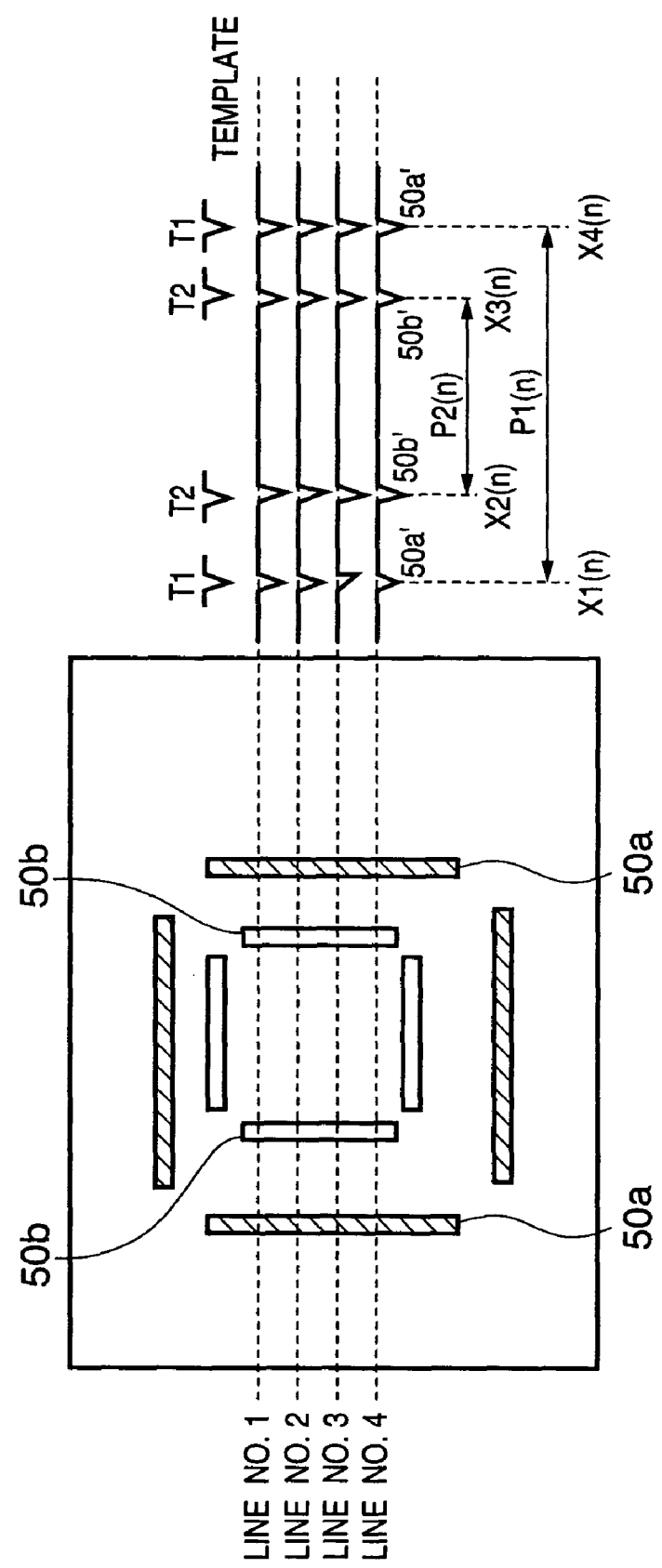
FIG. 17 is a diagram exemplifying a two-dimensional image, in which the overlay verification marks of FIG. 16 have been captured by an image sensor, and an intensity distribution of a line signal of every line.
Figure 18:
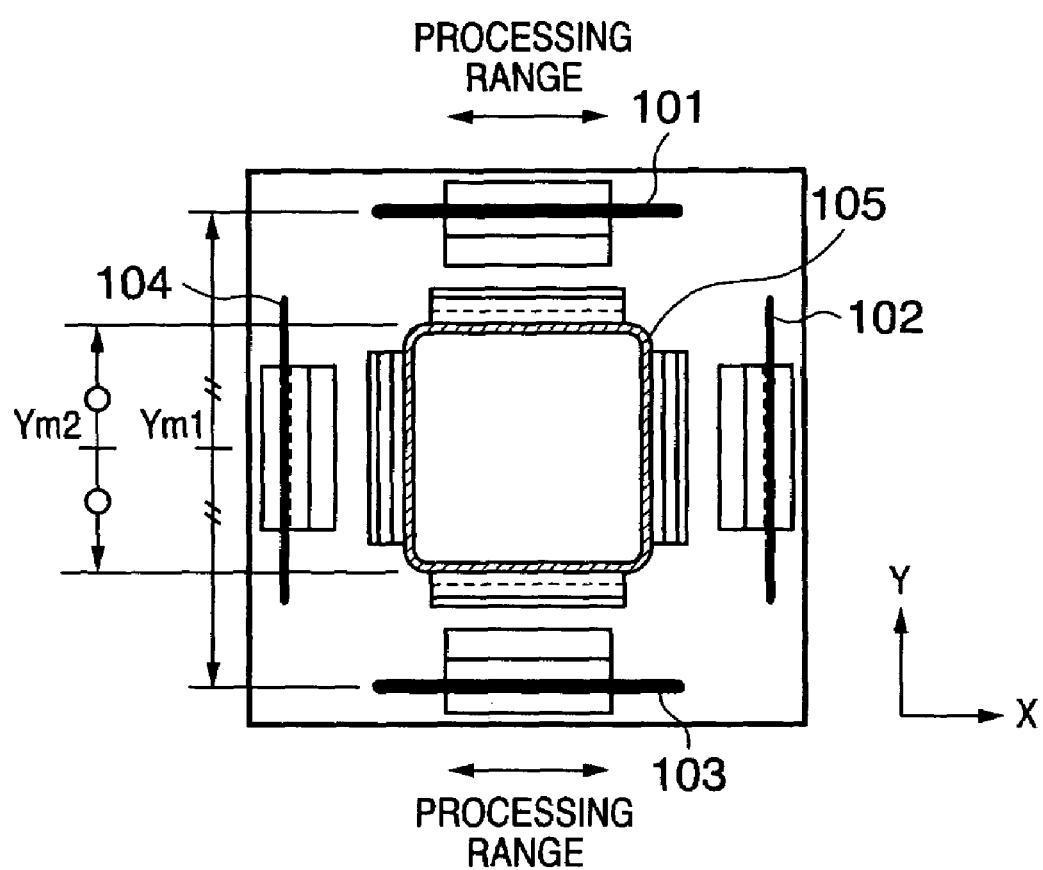
FIG. 18 is a diagram illustrating alignment marks acquired in a semiconductor manufacturing process.

FIG. 17 exemplifies a two-dimensional image, in which the overlay verification marks of FIG. 16 have been captured by the image sensor 23, and an intensity distribution of a line signal of every line. Position information [X1($n$), X2($n$), X3($n$), X4($n$) from the left, where n represents the line number] is detected with regard to line signals 50a' of the base marks 50a by a template T1 and with regard to line signals 50b' of the resist patterns 50b by a template T2.

Thereafter, distance P1($n$)=X4($n$)−X1($n$) between the two base marks 50a is found line by line, and distance P2($n$)=X3($n$)−X2($n$) between the two resist patterns 50b is found. To discriminate valid/unnecessary line signals in this embodiment, an average value P1a of P1($n$) and an average value P2a of P2($n$) acquired from each line signal are calculated, use is made only of line signals for which the deviation from the average value falls within a predetermined range, and the line signals of other lines are deemed unnecessary, as in the first embodiment. For example, line signals outside the standard deviation σ are deemed unnecessary and are excluded from processing for detecting positional deviation. Thus, the average value only of valid line signals is calculated and position information (X1a, X2a, X3a, X4a) of each of the marks 50a, 50b is found.

Positional deviation dX of the resist marks 50b with respect to the base marks 50a is obtained as follows:

$$dX = (Xb - Xa)/(Px \cdot M) \tag{12}$$

where M represents the image-forming magnification of the lenses 20, 21 and Px represents pixel pitch of the image sensor 23 in the detection direction. Here Xb, Xa are an intermediate position [Xb=(X2a+X3a)/2] of the line signals 50b' of the two resist marks 50b and an intermediate position [Xa=(X1a+X4a)/2] of the line signals 50a' of the two base marks 50a.

Similarly, with regard to the y direction, positional deviation along the Y direction can be detected by eliminating unnecessary lines using a two-dimensional image that has been detected by the image sensor 24 whose optic axis has been rotated by approximately 90° with respect to the optic axis of the image sensor 23.

It is also possible to discriminate valid/unnecessary line signals by the method of the second embodiment even in position detection according to the third embodiment. That is, positional deviation (xi,yi) of each shot on a wafer is detected, correction parameters (Sx, Sy, θx, θy, Bx, By) (linear component) are found by substituting this along with the overlay-verification mark position (Xi,Yi) into Equations (10), (11), and the residual error Ri (non-linear component) is found by substituting these parameters into Equation (9). The correction parameters (Sx, Sy, θx, θy, Bx, By) thus found become global alignment error of the exposure apparatus that exposes this wafer, and the residual error Ri corresponds to a value that is twice the positioning reproducibility precision of the wafer stage of the exposure apparatus. Furthermore, in a case where a mark has a defect, this can be judged by the fact that the residual error Ri exceeds the value that is twice the positioning reproducibility precision of the wafer stage. Thus, the residual error Ri is calculated with regard to each line of the image sensor, a value that is twice the positioning reproducibility precision of the wafer stage in a exposure apparatus that performs exposure evaluation is adopted as a threshold value, line signals for which this value is exceeded are judged to be unnecessary, and the average value of amount of positional deviation calculated with regard to the remaining valid line signals may be adopted as the result of detection.

Embodiment of Semiconductor Production System

Described next will be an example of a system for producing semiconductor devices (semiconductor chips such as IC and LSI chips, liquid crystal panels, CCDs, thin-film magnetic heads and micromachines, etc.) utilizing the exposure apparatus described above. This system utilizes a computer network outside the semiconductor manufacturing plant to provide troubleshooting and regular maintenance of manufacturing equipment installed at the manufacturing plant and to furnish maintenance service such as the provision of software.

Figure 19:
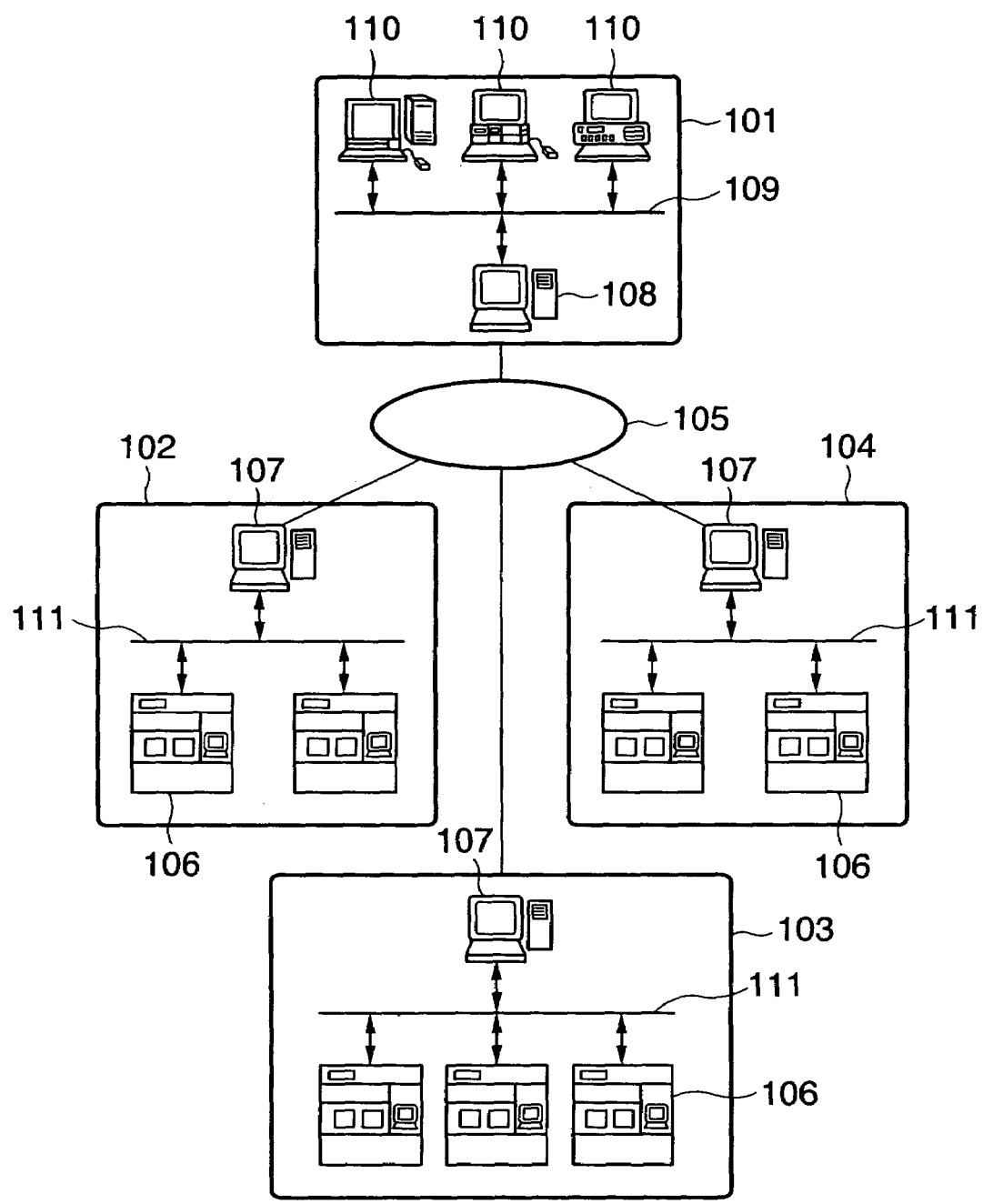
FIG. 19 is a conceptual view showing a semiconductor device production system, which includes the exposure apparatus of this embodiment, as seen from a certain angle.

FIG. 19 illustrates the overall system as seen from a certain angle. The system includes the business office 101 of the vendor (equipment supplier) that provides the equipment for manufacturing semiconductor devices. Semiconductor manufacturing equipment for various processes used in a semiconductor manufacturing plant is assumed to be the manufacturing equipment. Examples of the equipment are pre-treatment equipment (lithographic equipment such as exposure equipment, resist treatment equipment and etching equipment, heat treatment equipment, thin-film equipment and flattening equipment, etc.) and post-treatment equipment (assembly equipment and inspection equipment, etc.). The business office 101 includes a host management system 108 for providing a manufacturing-equipment maintenance database, a plurality of control terminal computers 110, and a local-area network (LAN) 109 for connecting these components into an intranet. The host management system 108 has a gateway for connecting the LAN 109 to the Internet 105, which is a network external to the business office 101, and a security function for limiting access from the outside.

Numerals 102 to 104 denote manufacturing plants of semiconductor makers which are the users of the manufacturing equipment. The manufacturing plants 102 to 104 may be plants belonging to makers that differ from one another or plants belonging to the same maker (e.g., pre-treatment plants and post-treatment plants, etc.). Each of the plants 102 to 104 is provided with a plurality of pieces of manufacturing equipment 106, a local-area network (LAN) 111 which connects these pieces of equipment to construct an intranet, and a host management system 107 serving as a monitoring unit for monitoring the status of operation of each piece of manufacturing equipment 106. The host management system 107 provided at each of the plants 102 to 104 has a gateway for connecting the LAN 111 in each plant to the Internet 105 serving as the external network of the plants. As a result, it is possible for the LAN of each plant to access the host management system 108 on the side of the vendor 101 via the Internet 105. By virtue of the security function of the host management system 108, users allowed to access the host management system 108 are limited. More specifically, status information (e.g., the condition of manufacturing equipment that has malfunctioned), which indicates the status of operation of each piece of manufacturing equipment 106, can be reported from the plant side to the vendor side. In addition, information in response to such notification (e.g., information specifying how to troubleshoot the problem, troubleshooting software and data, etc.), as well as the latest software and maintenance information such as help information, can be acquired from the vendor side. A communication protocol (TCP/IP), which is used generally over the Internet, is employed for data communication between the plants 102~104 and the vendor 101 and for data communication over the LAN 111 within each plant. Instead of utilizing the Internet as the external network of a plant, it is also possible to utilize a highly secure leased-line network (ISDN, etc.) that cannot be accessed by a third party. Further, the host management system is not limited to that provided by a vendor, for an arrangement may be adopted in which the user constructs a database, places it on an external network and allows the database to be accessed from a number of plants that belong to the user.

Figure 20:
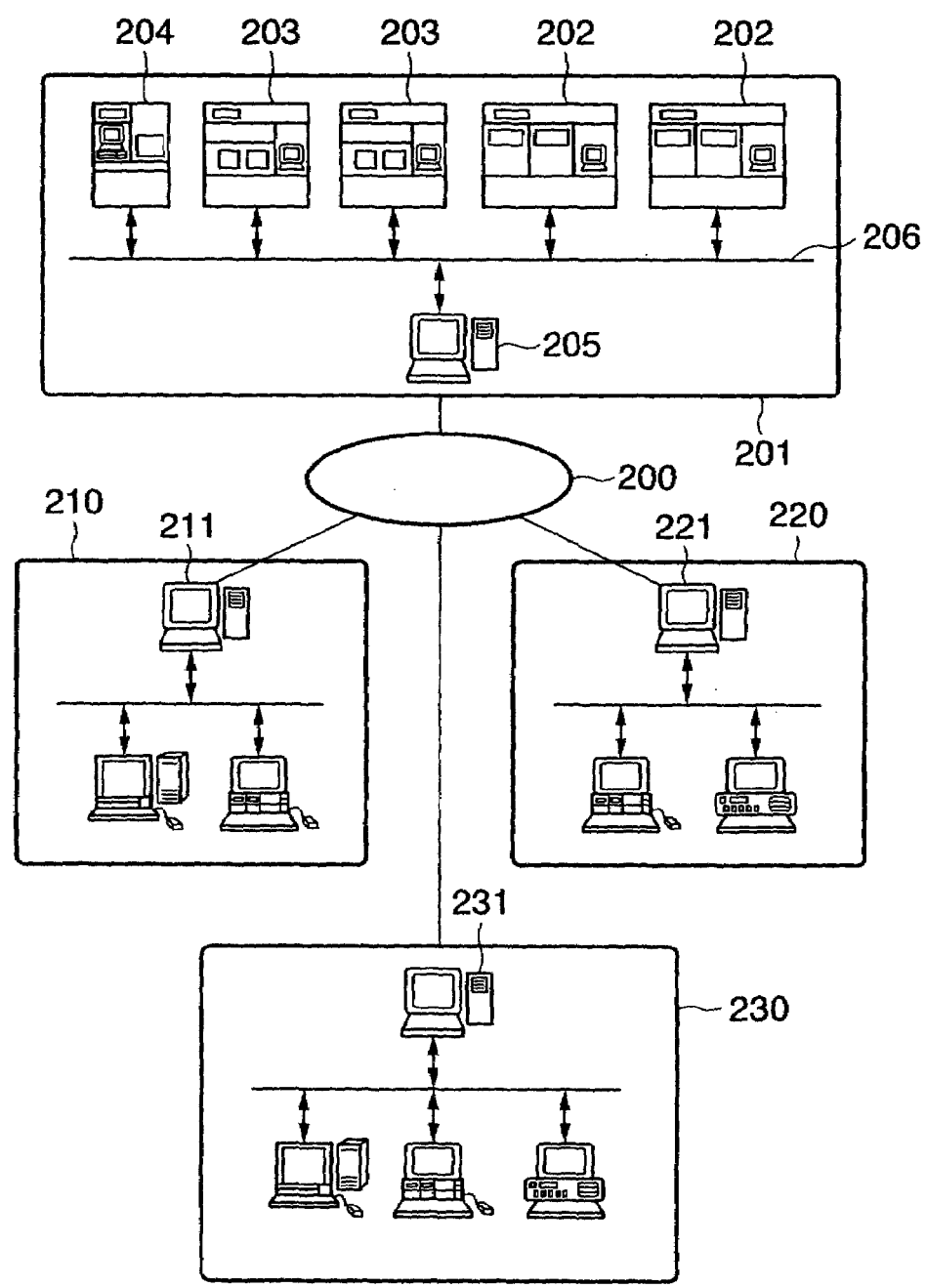
FIG. 20 is a conceptual view showing the semiconductor device production system, which includes the exposure apparatus of this embodiment, as seen from another angle.

FIG. 20 is a conceptual view illustrating the overall system of this embodiment as seen from an angle different from that depicted in FIG. 19. In the earlier example, a plurality of user plants each having manufacturing equipment are connected by an external network to the management system of the vendor that provided the manufacturing equipment, and information concerning the production management of each plant and information concerning at least one piece of manufacturing equipment is communicated by data communication via the external network. In the example of FIG. 20, on the other hand, a plant having manufacturing equipment provided by a plurality of vendors is connected by an outside network to management systems of respective ones of the vendors of these plurality of pieces of manufacturing equipment, and maintenance information for each piece of manufacturing equipment is communicated by data communication. As shown in the drawing, the system includes a manufacturing plant 201 of the user of manufacturing equipment (the maker of semiconductor devices). The manufacturing line of this plant includes manufacturing equipment for implementing a variety of processes. Examples of such equipment are exposure equipment 202, resist treatment equipment 203 and thin-film treatment equipment 204. Though only one manufacturing plant 201 is shown in FIG. 20, in actuality a plurality of these plants are networked in the same manner. The pieces of equipment in the plant are interconnected by a LAN 206 to construct an intranet and the operation of the manufacturing line is managed by a host management system 205. The business offices of vendors (equipment suppliers) such as an exposure equipment maker 210, resist treatment equipment maker 220 and thin-film treatment equipment maker 230 have host management systems 211, 221, 231, respectively, for remote maintenance of the equipment they have supplied. These have maintenance databases and gateways to the outside network, as described earlier. The host management system 205 for managing each piece of equipment in the manufacturing plant of the user is connected to the management systems 211, 221, 231 of the vendors of these pieces of equipment by the Internet or leased-line network serving as an external network 200. If any of the series of equipment in the manufacturing line malfunctions, the line ceases operating. However, this can be dealt with rapidly by receiving remote maintenance from the vendor of the faulty equipment via the Internet 200, thereby making it possible to minimize line downtime.

Figure 21:
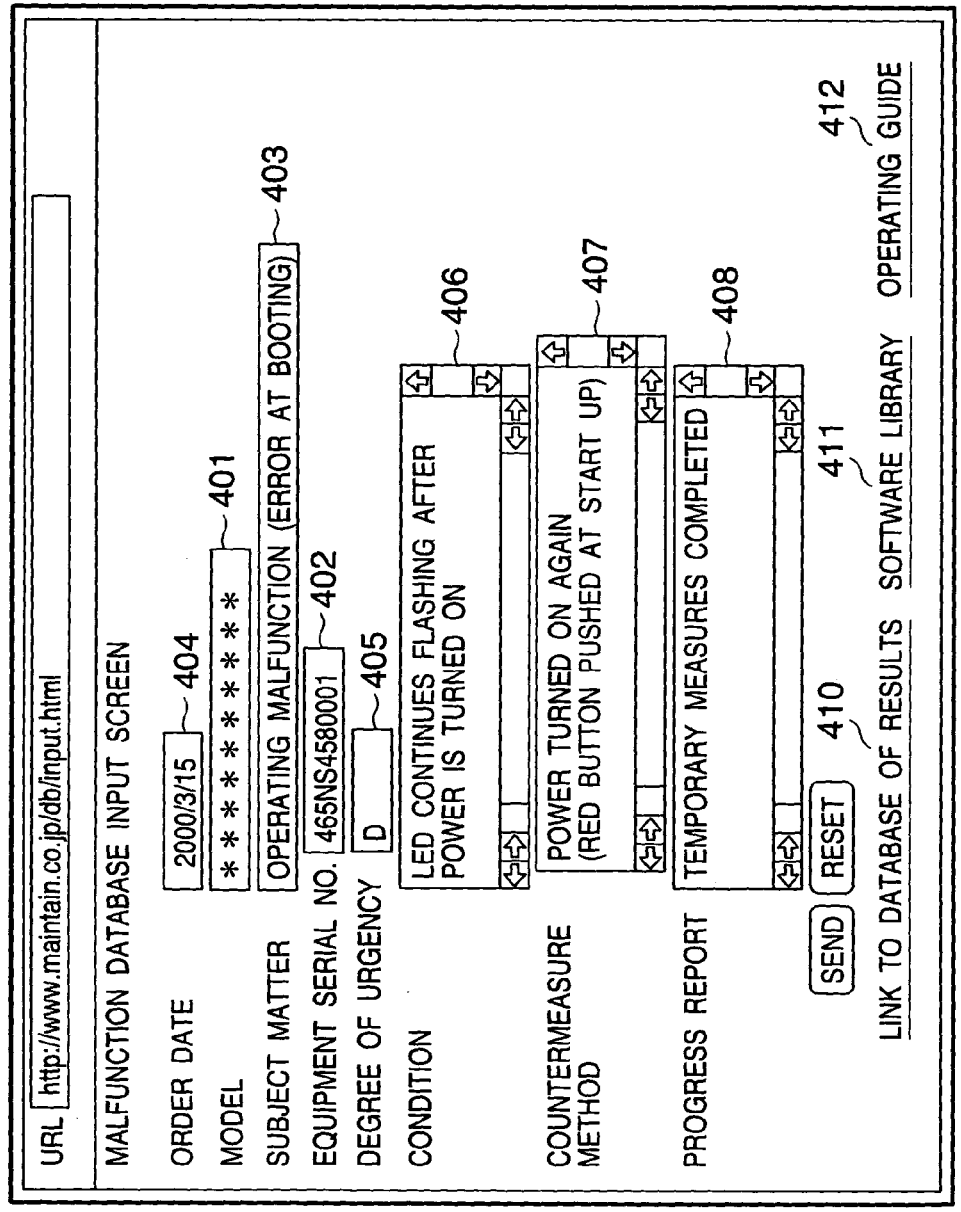
FIG. 21 shows a specific example of a user interface in the semiconductor device production system that includes the exposure apparatus of this embodiment.

Each piece of manufacturing equipment installed in the semiconductor manufacturing plant has a display, a network interface and a computer for executing network-access software and equipment operating software stored in a storage device. The storage device can be an internal memory or hard disk or a network file server. The software for network access includes a special-purpose or general-purpose Web browser and presents a user interface, which has a screen of the kind shown by way of example in FIG. 21, on the display. The operator managing the manufacturing equipment at each plant enters information at the input items on the screen while observing the screen. The information includes model 401 of the manufacturing equipment, its serial number 402, subject matter 403 of the problem, its date of occurrence 404, degree of urgency 405, the particular condition 406, countermeasure method 407 and progress report 408. The entered information is transmitted to the maintenance database via the Internet. The resulting appropriate maintenance information is sent back from the maintenance database and is presented on the display screen. The user interface provided by the Web browser implements hyperlink functions 410, 411, 412 as illustrated and enables the operator to access more detailed information for each item, to extract the latest version of software, which is used for the manufacturing equipment, from a software library provided by the vender, and to acquire an operating guide (help information) for reference by the plant operator. The maintenance information provided by the maintenance database also includes information relating to the present invention described above, and the above-mentioned software library also provides the latest software for implementing the present invention.

A process for manufacturing a semiconductor device utilizing the semiconductor exposure apparatus set forth above will now be described.

Figure 22:
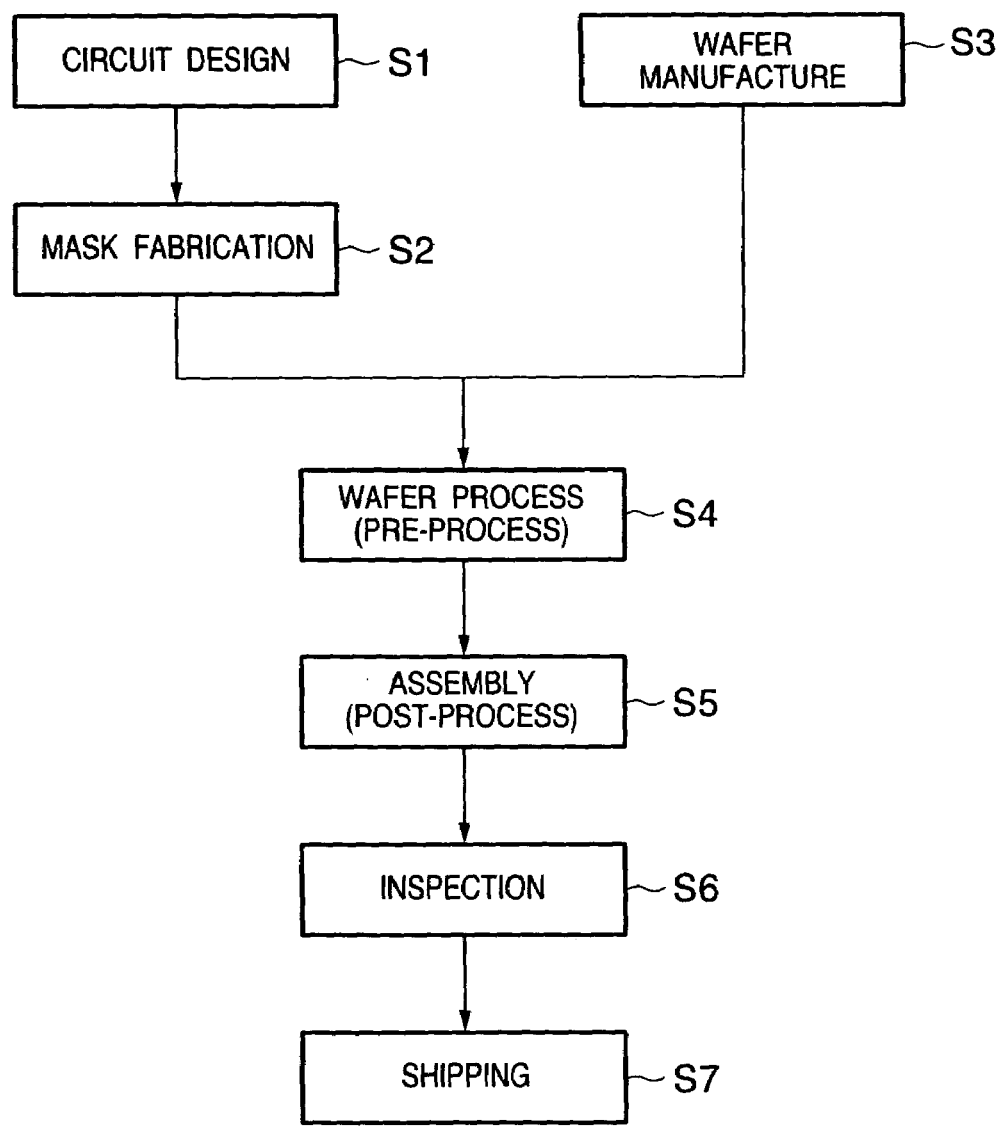
FIG. 22 is a flowchart useful in describing the flow of a device manufacturing process that uses the exposure apparatus according to this embodiment.

FIG. 22 illustrates the overall flow of a process for manufacturing a semiconductor device. The circuit for the device is designed at step S1 (circuit design). A mask on which the designed circuit pattern has been formed is fabricated at step S2 (mask fabrication). Meanwhile, a wafer is manufactured using a material such as silicon or glass at step S3 (wafer manufacture). The actual circuit is formed on the wafer by lithography, using the mask and wafer that have been prepared, at step S4 (wafer process), which is also referred to as "pre-treatment". A semiconductor chip is obtained, using the wafer fabricated at step S4, at step S5 (assembly), which is also referred to as "post-treatment". This step includes steps such as assembly (dicing and bonding) and packaging (chip encapsulation). The semiconductor device fabricated at step S5 is subjected to inspections such as an operation verification test and durability test at step S6 (inspection). The semiconductor device is completed through these steps and then is shipped (step S7). The pre- and post-treatments are performed at separate special-purpose plants. Maintenance is carried out on a per-plant basis by the above-described remote maintenance system. Further, information for production management and equipment maintenance is communicated by data communication between the pre- and post-treatment plants via the Internet or leased-line network.

Figure 23:
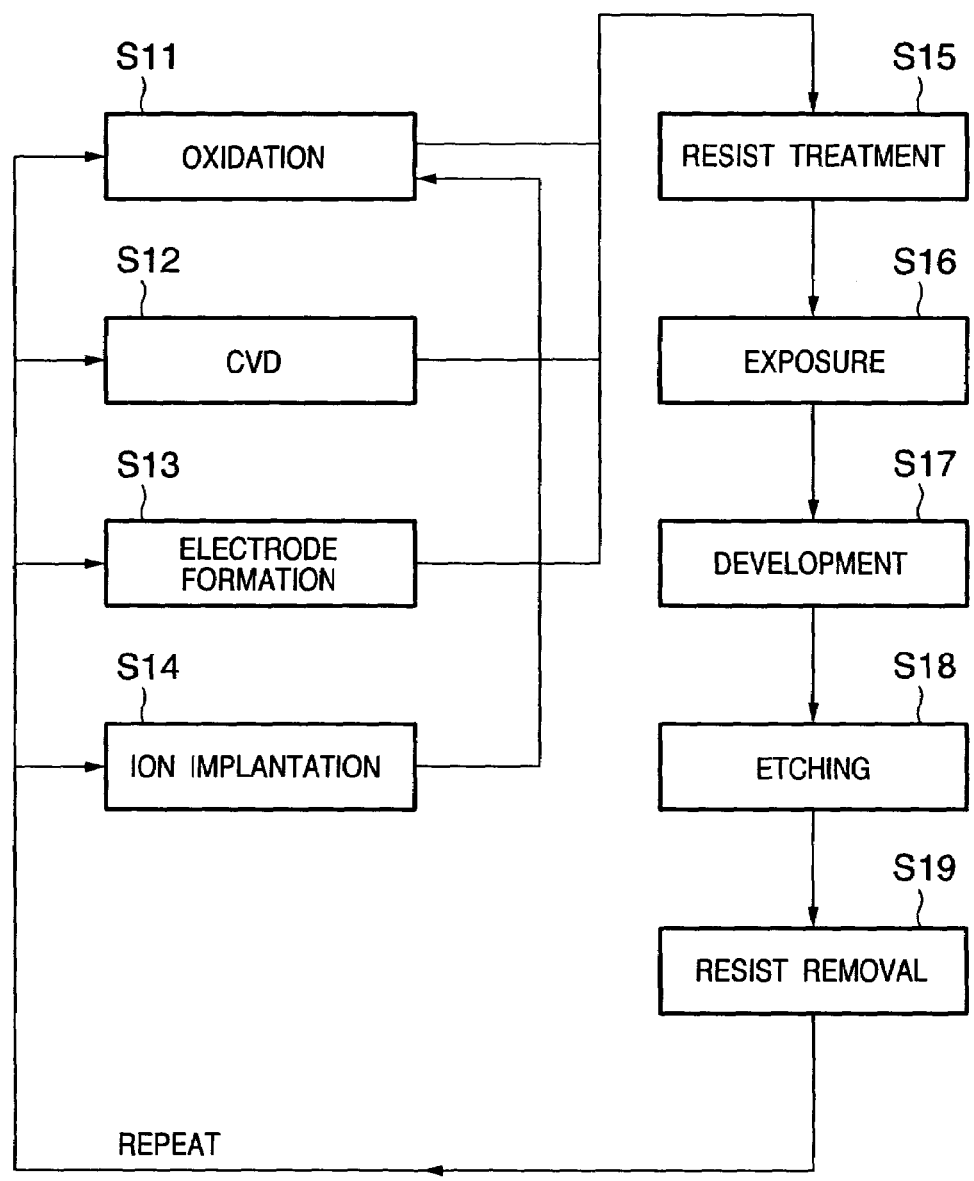
FIG. 23 is a diagram useful in describing a wafer process that uses the exposure apparatus according to this embodiment.

FIG. 23 is a flowchart illustrating the detailed flow of the wafer process mentioned above. The surface of the wafer is oxidized at step S11 (oxidation). An insulating film is formed on the wafer surface at step S12 (CVD), electrodes are formed on the wafer by vapor deposition at step S13 (electrode formation), and ions are implanted in the wafer at step S14 (ion implantation). The wafer is coated with a photoresist at step S15 (resist treatment), the wafer is exposed to the circuit pattern of the mask to print the pattern onto the wafer by the above-described exposure apparatus at step S16 (exposure), and the exposed wafer is developed at step S17 (development). Portions other than the developed photoresist are etched away at step S18 (etching), and unnecessary resist left after etching is performed is removed at step S19 (resist removal). Multiple circuit patterns are formed on the wafer by implementing these steps repeatedly. Since the manufacturing equipment used at each step is maintained by the remote maintenance system described above, malfunctions can be prevented and quick recovery is possible if a malfunction should happen to occur. As a result, the productivity of semiconductor device manufacture can be improved over the prior art.

The above embodiments are such that in a case where the planarity of a wafer is defective owing to process factors, the fact that forcible exposure is possible means that it is possible to minimize the influence upon shots exposed normally at the periphery at the time of etching. As a result, wafer yield is improved.

In a case where the planarity of a wafer is defective owing to chuck factors, a function is provided for storing, between wafers, the location at which a focusing control error has occurred. In addition to the above-mentioned effect, therefore, it is possible to discover contamination of the wafer chuck quickly.

Further, in a case where focusing control error has occurred owing to the effects of disturbance from the floor or the like, a function is provided for suspending exposure and then re-trying the same if the error has occurred before scanning exposure. As a result, the rate of improperly exposed shots can be reduced and yield is improved.

Furthermore, by providing a function through which the above-mentioned retry and decision regarding forcible exposure are performed automatically, it is possible to minimize apparatus downtime during which the apparatus waits for a decision from the operator. This improves the availability rate of the apparatus.

The present invention is not limited to the above embodiments and various changes and modifications can be made within the spirit and scope of the present invention. Therefore, to apprise the public of the scope of the present invention, the following claims are made.

What is claimed is:

1. A position detection method for detecting a position of a substrate in a detection direction of a position detection mark substantially parallel to a surface of the substrate upon receiving light from the position detection mark formed in a shot on the surface of the substrate, comprising:

an image information acquisition step of obtaining two-dimensional image information of the position detection mark from the light that has been received by an image sensor having a plurality of lines of which a plurality of pixels are arrayed in a detection direction of the position detection mark substantially parallel to the surface of the substrate and in a direction orthogonal to the detection direction;

a conversion step of converting the image information to a plurality of light-intensity signals for each line of the plurality of lines, the plurality of light intensity signals being primary image signals obtained from the lights from different areas of a mark area in the shot in the direction of the position detection mark substantially parallel to the surface of the substrate and in the direction orthogonal to the detection direction;

a determination step of determining whether the light-intensity signal of each line of the plurality of lines is valid or not; and a position information calculation step of calculating position information of the position detection mark from light-intensity signals of only valid lines other than light-intensity signals of invalid lines.

2. The method according to claim 1, wherein said determination step includes finding intervals of the position detection marks and determining that a valid light-intensity signal is a light-intensity signal of a line for which a deviation with respect to an average signal of the mark intervals found for all lines is less than a predetermined value.

3. The method according to claim 1, further comprising:

an error information calculation step of calculation information representing an error of a position detection mark, which corresponds to the position information, with respect to a reference position; and a residual-error information calculation step of calculating residual-error information that is the result of eliminating a prescribed error component from the information representing the error; wherein said determination step includes determining that a light-intensity signal of a line for which the residual-error information is less than a predetermined value is valid.

4. The method according to claim 1, wherein the substrate is a semiconductor substrate supplied to a semiconductor manufacturing process, and the position detection marks include at least one of a preceding-step mark formed by etching at a preceding step and a present-step mark formed by a resist at a step that follows said preceding step.

5. The method according to claim 1, wherein the substrate is a semiconductor substrate supplied to a semiconductor manufacturing process, and the position detection marks include at least one of a preceding-step mark formed by etching at a preceding step and a present-step mark formed by a resist at a step that follows said preceding step; and said error-information calculation step calculates information representing an error between the preceding-step mark and the present-step mark.

6. The method according to claim 1, wherein a position detection mark is provided also in the direction that is substantially orthogonal to the direction in which the position detection marks are detected, and said image information acquisition step further calculates image information of this position detection mark in the direction substantially orthogonal to the direction in which the position detection marks are detected.

7. The method according to claim 1, wherein said image information acquisition step calculates image information that has been rotated through a predetermined angle with respect to the direction in which the position detection marks are detected.

8. The method according to claim 3, wherein if x and y directions are taken as mutually orthogonal directions having the reference position as the origin thereof, the information representing the error is represented, as a deviation in the position of the position detection mark from the reference position, by shift Sx in the x direction, shift Sy in the y direction, inclination θx with respect to the x axis, inclination θy with respect to the y axis, magnification Bx along the x direction and magnification By along the y direction, and the prescribed error component is obtained in accordance with the following equation:

$$D'i = \begin{pmatrix} Bx & -\theta y \\ \theta x & By \end{pmatrix} Di + \begin{pmatrix} Sx \\ Sy \end{pmatrix}.$$

* * * * *